US010659008B2

(12) United States Patent
Ota et al.

(10) Patent No.: US 10,659,008 B2
(45) Date of Patent: May 19, 2020

(54) MULTIPLEXER, TRANSMITTING DEVICE, AND RECEIVING DEVICE

(71) Applicant: Murata Manufacturing Co., Ltd., Nagaokakyo-shi, Kyoto-fu (JP)

(72) Inventors: Noriyoshi Ota, Nagaokakyo (JP); Sunao Yamazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/666,559

(22) Filed: Oct. 29, 2019

(65) Prior Publication Data
US 2020/0067491 A1 Feb. 27, 2020

Related U.S. Application Data

(63) Continuation of application No. PCT/JP2018/020240, filed on May 25, 2018.

(30) Foreign Application Priority Data

May 30, 2017 (JP) ................................. 2017-106679

(51) Int. Cl.
*H03H 9/72* (2006.01)
*H03H 7/38* (2006.01)
(Continued)

(52) U.S. Cl.
CPC ............... *H03H 9/72* (2013.01); *H03H 7/38* (2013.01); *H03H 9/02866* (2013.01);
(Continued)

(58) Field of Classification Search
CPC combination set(s) only.
See application file for complete search history.

(56) References Cited

U.S. PATENT DOCUMENTS

2007/0159269 A1* 7/2007 Taniguchi .............. H03H 9/008
333/133
2011/0221542 A1 9/2011 Kihara
(Continued)

FOREIGN PATENT DOCUMENTS

JP    2015-201808 A     11/2015
KR    10-2015-0036732 A  4/2015
(Continued)

OTHER PUBLICATIONS

Official Communication issued in International Patent Application No. PCT/JP2018/020240, dated Aug. 7, 2018.

*Primary Examiner* — Jungpeng Chen
(74) *Attorney, Agent, or Firm* — Keating & Bennett, LLP

(57) ABSTRACT

In a multiplexer, input or output terminals of four acoustic wave filters are connected to, among a plurality of terminals provided on piezoelectric substrates, antenna terminals connected to an antenna connection terminal; the four acoustic wave filters include a first acoustic wave filter and a second acoustic wave filter that is located at a farther position from the antenna connection terminal than a position of the first acoustic wave filter in a plan view of a substrate; and among the plurality of terminals, the terminals located at the closest position to the antenna connection terminal in the plan view of the substrate are connected to the second acoustic wave filter as the antenna terminals.

17 Claims, 16 Drawing Sheets

(51) Int. Cl.
*H03H 9/25* (2006.01)
*H04B 1/52* (2015.01)
*H03H 9/02* (2006.01)
*H03H 9/145* (2006.01)
*H03H 9/64* (2006.01)

(52) U.S. Cl.
CPC .......... *H03H 9/14544* (2013.01); *H03H 9/25* (2013.01); *H03H 9/6483* (2013.01); *H04B 1/52* (2013.01)

(56) References Cited

U.S. PATENT DOCUMENTS

| | | |
|---|---|---|
| 2013/0329611 A1* | 12/2013 | Kitajima ................ H04B 1/006 370/278 |
| 2015/0155850 A1 | 6/2015 | Kuzushita et al. |
| 2015/0295697 A1 | 10/2015 | Kawachi et al. |
| 2017/0194939 A1 | 7/2017 | Mukai |
| 2018/0109243 A1 | 4/2018 | Takamine |
| 2018/0343000 A1* | 11/2018 | Nosaka .................... H04B 1/00 |

FOREIGN PATENT DOCUMENTS

| | | |
|---|---|---|
| WO | 2010/067497 A1 | 6/2010 |
| WO | 2016/056377 A1 | 4/2016 |
| WO | 2016/208670 A1 | 12/2016 |

\* cited by examiner

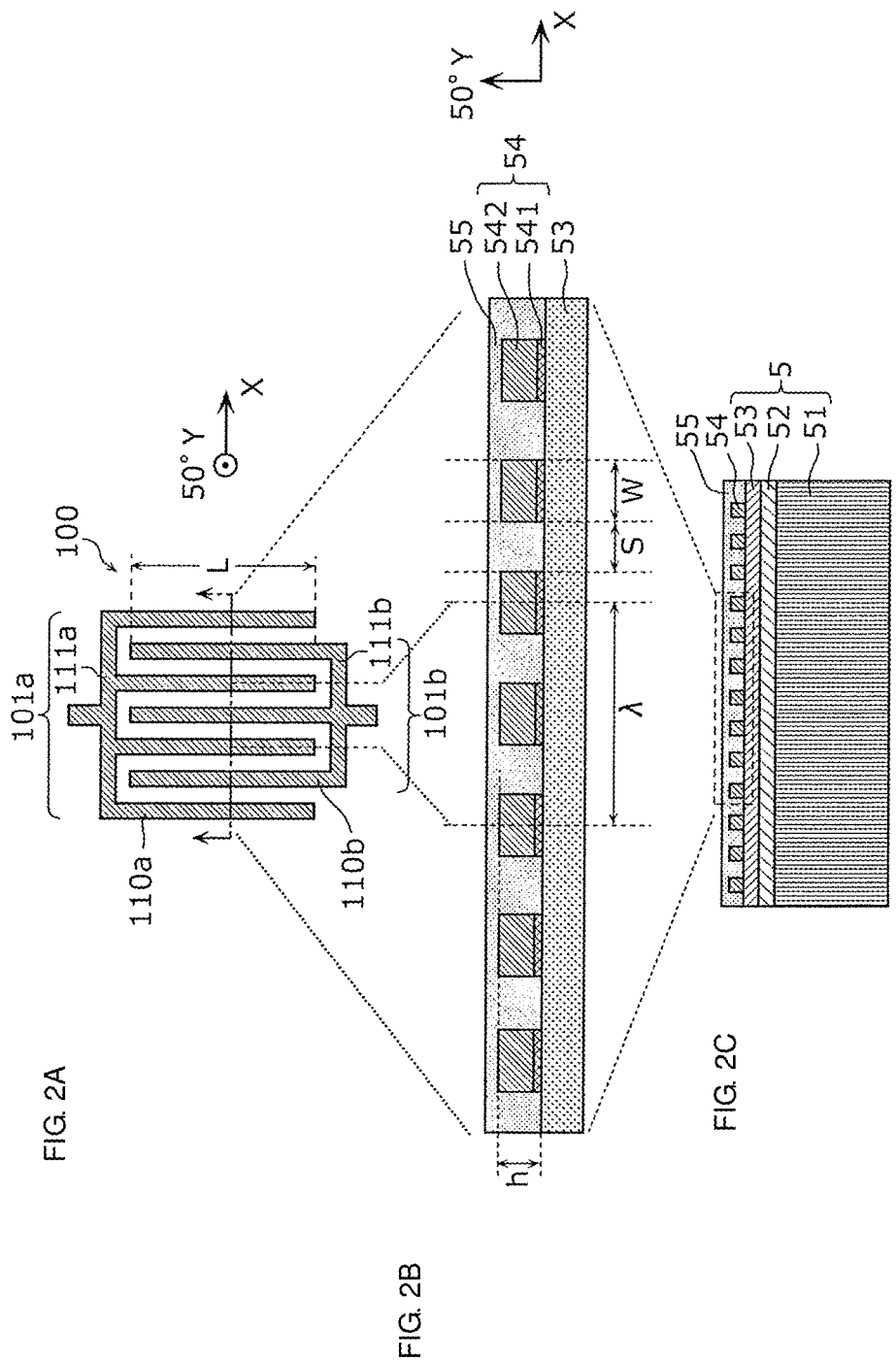

ature of the present invention.

MULTIPLEXER, TRANSMITTING DEVICE, AND RECEIVING DEVICE

CROSS REFERENCE TO RELATED APPLICATIONS

This application claims the benefit of priority to Japanese Patent Application No. 2017-106679 filed on May 30, 2017 and is a Continuation Application of PCT Application No. PCT/JP2018/020240 filed on May 25, 2018. The entire contents of each application are hereby incorporated herein by reference.

BACKGROUND OF THE INVENTION

1. Field of the Invention

The present invention relates to a multiplexer, a transmitting device, and a receiving device, each including an acoustic wave filter.

2. Description of the Related Art

Cellular phones today are required to support a plurality of frequency bands and a plurality of radio systems, that is, required to support multi-band and multi-mode operations with a single terminal. To meet the requirement, a multiplexer configured to demultiplex a high frequency signal including a plurality of radio carrier frequencies is disposed directly next to a single antenna. As a plurality of band pass filters defining a multiplexer, acoustic wave filters are used that exhibit a low loss property in a pass band and steepness of bandpass characteristics in the periphery of the pass band.

International Publication No. 2016/208670 discloses an acoustic wave device (SAW duplexer) having a configuration in which a plurality of acoustic wave filters is connected. Specifically, in a connection path between an antenna element and a common connection terminal to which a reception-side acoustic wave filter and a transmission-side acoustic wave filter are connected in common, an inductance element for achieving impedance matching between the antenna element and the common connection terminal is connected in series. With this inductance element, it is possible to cause complex impedance when the plurality of acoustic wave filters are seen from the common connection terminal to which the capacitive acoustic wave filters are connected, to approach the characteristic impedance. Thus, deterioration in the property of insertion loss is prevented.

However, when it is attempted to achieve impedance matching between an antenna element and a common connection terminal, capacitance is generated between the ground and a wiring provided between each filter and a common connection terminal as well as a wiring provided between the common connection terminal and the inductance element. In other words, since the ground and the wiring that connects an antenna terminal to which the antenna element is connected and each of the acoustic wave filters, are capacitively coupled, the complex impedance when the acoustic wave filters are seen from the common connection terminal cannot be made to approach the characteristic impedance (50Ω). This makes it difficult to achieve the impedance matching between the antenna element and the common connection terminal. Because of this, there arises a problem that the property of insertion loss of each acoustic wave filter is deteriorated. In particular, as the number of acoustic wave filters connected to the common connection terminal increases, the number of wirings connecting the acoustic wave filters and the common connection terminal increases, and the length thereof becomes longer. Accordingly, since the capacitance generated between these wirings and the ground increases, there arises a problem that it is further difficult to achieve the impedance matching between the antenna element and the common connection terminal so that the property of insertion loss is deteriorated.

SUMMARY OF THE INVENTION

Preferred embodiments of the present invention provide multiplexers, transmitting devices, and receiving devices that are each able to reduce the capacitance generated between the ground and the wiring provided between acoustic wave filters and an antenna terminal to which an antenna element is connected, and are each able to decrease insertion loss in a pass band of each of the acoustic wave filters.

A multiplexer according to a preferred embodiment of the present invention transmits and receives a plurality of high frequency signals via an antenna element and includes an antenna connection terminal provided on a first surface of a substrate and connected to the antenna element; and at least three acoustic wave filters mounted on a second surface of the substrate opposing the first surface, and having mutually different pass bands. In the multiplexer, the at least three acoustic wave filters are connected to a common connection terminal; a first inductance element is connected in a connection path between the antenna connection terminal and the common connection terminal; each of the at least three acoustic wave filters includes, on a piezoelectric substrate, at least one of a serial arm resonator connected between an input terminal and an output terminal, and a parallel arm resonator connected between a reference terminal and a connection path connecting the input terminal and the output terminal; the input terminal or the output terminal is connected to, among a plurality of terminals provided on the piezoelectric substrate, an antenna terminal connected to the antenna connection terminal; the at least three acoustic wave filters include at least one first acoustic wave filter and at least one second acoustic wave filter that is located at a farther position from the antenna connection terminal than a position of the first acoustic wave filter in a plan view of the substrate; and among the plurality of terminals, a terminal located at the closest position to the antenna connection terminal in the plan view of the substrate is connected to the second acoustic wave filter as the antenna terminal.

According to the above features, in the substrate, it is possible to shorten the length of a wiring connecting the antenna connection terminal and the antenna terminal of the second acoustic wave filter, among the at least three acoustic wave filters defining the multiplexer, which is located at a farther position than that of the first acoustic wave filter from the antenna connection terminal. This makes it possible to reduce capacitance generated between the ground and the wiring connecting the antenna terminal of the second acoustic wave filter and the antenna connection terminal. Thus, it is possible to reduce insertion loss of the multiplexer.

In addition, the at least three acoustic wave filters may include two or more of the second acoustic wave filters, and the antenna terminals of the two or more second acoustic wave filters may be connected to each other on the substrate and then may be connected to the common connection terminal.

Thus, in the case where the plurality of second acoustic wave filters is provided, by common-connecting the antenna terminals of the plurality of second acoustic wave filters, a total length of the wiring connecting the antenna connection terminal and the antenna terminal of each of the plurality of second acoustic wave filters can be shortened in comparison with a case where the antenna terminal of each of the plurality of second acoustic wave filters is separately connected to the antenna connection terminal. Thus, it is possible to further reduce the insertion loss of the multiplexer.

In addition, the substrate may include a plurality of layers, and the wiring connecting the antenna connection terminal and the antenna terminals of the at least three acoustic wave filters may be provided in one of the plurality of layers.

Thus, by providing the wiring connecting the antenna terminals of the second acoustic wave filters and the antenna connection terminal in a single layer, it is possible to significantly reduce or prevent routing of the wiring across the plurality of layers. This makes it possible to shorten the length of the wiring connecting the antenna terminals of the second acoustic wave filters and the antenna connection terminal. Accordingly, it is possible to further reduce the insertion loss of the multiplexer.

In addition, the wiring may be provided on the second surface of the substrate.

Thus, in the substrate, by providing the wiring to which the antenna terminals of the second acoustic wave filters are connected in the layer where the at least three acoustic wave filters are mounted, a total length of the wiring from the antenna terminals of the second acoustic wave filters to the antenna connection terminal can be shortened. This makes it possible to further reduce the insertion loss of the multiplexer.

In addition, each of the at least three acoustic wave filters may be provided on the single piezoelectric substrate.

Further, the piezoelectric substrate may include a piezoelectric film, on a first surface of which an IDT (InterDigital Transducer) electrode is provided; a high acoustic-velocity support substrate in which a bulk wave propagates at a higher acoustic velocity than an acoustic velocity of an acoustic wave that propagates in the piezoelectric film; and a low acoustic-velocity film which is located between the high acoustic-velocity support substrate and the piezoelectric film, and in which a bulk wave propagates at a lower acoustic velocity than an acoustic velocity of a bulk wave that propagates in the piezoelectric film.

In a multiplexer according to a preferred embodiment of the present invention, circuit elements, for example, an inductance element and a capacitance element, may be added in order to achieve impedance matching between a plurality of acoustic wave filters, as in a case where a second inductance element is connected in series to the common connection terminal side of one acoustic wave filter. In this case, it is assumed that the Q value of each resonator is equivalently small. However, according to the laminated structure of the present piezoelectric substrate, it is possible to maintain the Q value of each resonator at a high value. Thus, it is possible to provide an acoustic wave filter with a low loss property in the band.

The multiplexer may include, as the at least three acoustic wave filters, a third acoustic wave filter of the acoustic wave filter having a first pass band and that outputs a transmission signal to the antenna element; a fourth acoustic wave filter of the acoustic wave filter having a second pass band adjacent to or in a vicinity of the first pass band and that inputs a reception signal from the antenna element; a fifth acoustic wave filter of the acoustic wave filter having a third pass band present on a lower frequency side relative to the first pass band as well as the second pass band, and that outputs a transmission signal to the antenna element; and a sixth acoustic wave filter of the acoustic wave filter having a fourth pass band present on a higher frequency side relative to the first pass band as well as the second pass band, and that inputs a reception signal from the antenna element, wherein a second inductance element may be connected between the common connection terminal and at least one of the second acoustic wave filter and the fourth acoustic wave filter.

With this configuration, it is possible to match the complex impedance seen from the common connection terminal of the multiplexer including a circuit in which combined are a circuit where the second inductance element and one acoustic wave filter are connected in series and a circuit where the acoustic wave filters other than the one acoustic wave filter are connected in parallel at the common connection terminal with the characteristic impedance while securing a low loss property in the pass band.

A transmitting device according to a preferred embodiment of the present invention inputs a plurality of high frequency signals having mutually different carrier frequency bands, filters the plurality of high frequency signals, and wirelessly transmits the filtered high frequency signals from an antenna element being shared, and includes an antenna connection terminal provided on a first surface of a substrate and connected to the antenna element; and at least three acoustic wave filters for transmission mounted on a second surface of the substrate opposing the first surface, and that input a plurality of high frequency signals from a transmitting circuit and each allow only a predetermined frequency band to pass through. In the transmitting device, the at least three acoustic wave filters for transmission are common-connected to a common connection terminal; a first inductance element is connected in a connection path between the antenna connection terminal and the common connection terminal; each of the at least three acoustic wave filters for transmission includes, on a piezoelectric substrate, at least one of a serial arm resonator connected between an input terminal and an output terminal and a parallel arm resonator connected between a reference terminal and a connection path connecting the input terminal and the output terminal; the output terminal is connected to, among a plurality of terminals provided on the piezoelectric substrate, an antenna terminal connected to the antenna connection terminal; the at least three acoustic wave filters for transmission include at least one first acoustic wave filter for transmission and at least one second acoustic wave filter for transmission that is located at a farther position than a position of the first acoustic wave filter for transmission from the antenna connection terminal in a plan view of the substrate; and among the plurality of terminals, a terminal located at the closest position to the antenna connection terminal in the plan view of the substrate is connected to the second acoustic wave filter for transmission as the antenna terminal.

A receiving device according to a preferred embodiment of the present invention inputs, via an antenna element, a plurality of high frequency signals having mutually different carrier frequency bands, demultiplexes the plurality of high frequency signals, and outputs the demultiplexed high frequency signals to a receiving circuit, and includes: an antenna connection terminal provided on a first surface of a substrate and connected to the antenna element; and at least three acoustic wave filters for reception mounted on a second surface of the substrate opposing the first surface, and that input a plurality of high frequency signals from the antenna element and each allow only a predetermined frequency band to pass through. In the stated receiving device, the at least three acoustic wave filters for reception are common-connected to a common connection terminal; a first inductance element is connected in a connection path between the antenna connection terminal and the common connection terminal; each of the at least three acoustic wave filters for reception includes, on a piezoelectric substrate, at least one of a serial arm resonator connected between an input terminal and an output terminal, and a parallel arm resonator connected between a reference terminal and a connection path connecting the input terminal and the output terminal; the input terminal is connected to, among a plurality of terminals provided on the piezoelectric substrate, an antenna terminal connected to the antenna connection terminal; the at least three acoustic wave filters for reception include at least one first acoustic wave filter for reception and at least one second acoustic wave filter for reception that is located at a farther position than a position of the first acoustic wave filter for reception from the antenna connection terminal in a plan view of the substrate; and among the plurality of terminals, a terminal located at the closest position to the antenna connection terminal in the plan view of the substrate is connected to the second acoustic wave filter for reception as the antenna terminal.

Thus, even if an inductance element having a low Q value is used, it is possible to provide low-loss transmitting devices and low-loss receiving devices in which the insertion loss in the pass band of each filter is reduced.

With the multiplexers, the transmitting devices, and the receiving devices according to preferred embodiments of the present invention, it is possible to reduce the capacitance generated between the ground and the wiring provided between each of the acoustic wave filters and the antenna connection terminal to which the antenna element is connected, and to reduce the insertion loss in the pass band of each of the acoustic wave filters.

The above and other elements, features, steps, characteristics, and advantages of the present invention will become more apparent from the following detailed description of the present preferred embodiments with reference to the attached drawings.

BRIEF DESCRIPTION OF THE DRAWINGS

FIGS. 2A to 2C are plan views and cross-sectional views showing a resonator of a surface acoustic wave filter according to a preferred embodiment of the present invention.

DETAILED DESCRIPTION OF THE PRESENT PREFERRED EMBODIMENTS

Figure 1:
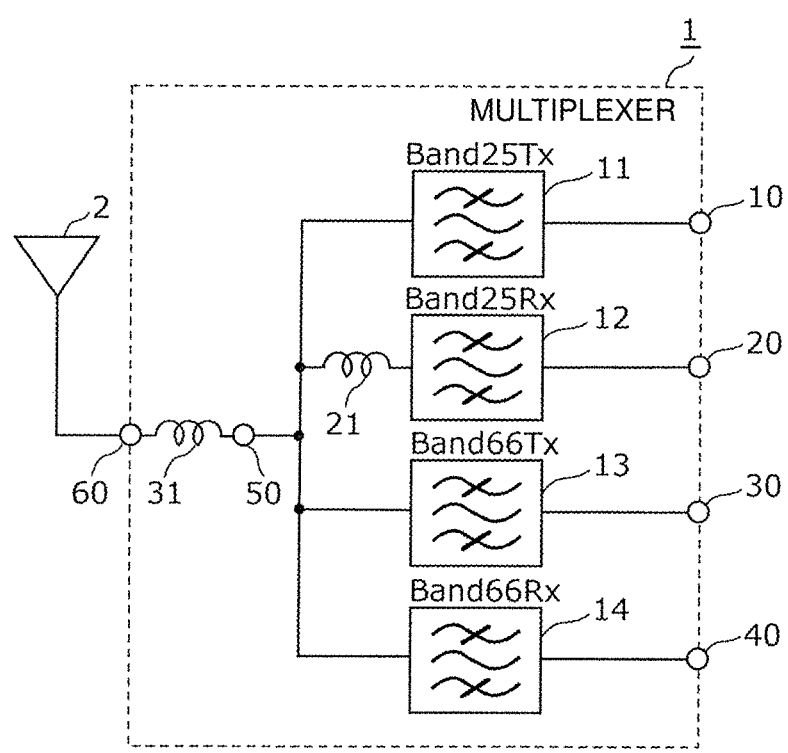
FIG. 1 is a circuit diagram of a multiplexer according to a preferred embodiment of the present invention.

Hereinafter, preferred embodiments of the present invention will be described in detail with reference to the drawings. Each of the present preferred embodiments described below represents a comprehensive or specific example. Numerical values, shapes, materials, elements, arrangements and connection configurations of the elements, and the like indicated in the following preferred embodiments are merely examples, and are not intended to limit the present invention. Of the elements in the following preferred embodiments, those that are not described in the independent claims will be described as arbitrary or optional elements. In addition, sizes or size ratios of the elements shown in the drawings are not necessarily strict.

PREFERRED EMBODIMENT

1. Basic Configuration of Multiplexer

In a preferred embodiment of the present invention, a quadplexer applied to Band25 (transmission pass band: about 1850-1915 MHz, reception pass band: about 1930-1995 MHz) and Band66 (transmission pass band: about 1710-1780 MHz, reception pass band: about 2110-2200 MHz) of FDD-LTE (Frequency Division Duplex-Long Term Evolution) will be cited as an example and described.

A multiplexer 1 according to the present preferred embodiment is a quadplexer in which a duplexer for Band25 and a duplexer for Band66 are connected at a common connection terminal 50.

FIG. 1 is a circuit diagram of the multiplexer 1 according to the present preferred embodiment. As shown in FIG. 1, the multiplexer 1 includes transmission-side filters 11 and 13, reception-side filters 12 and 14, an inductance element 21 (a second inductance element), the common connection terminal 50, an antenna connection terminal 60, transmission input terminals 10 and 30 and reception output terminals 20 and 40. The multiplexer 1 is connected to an antenna element 2 at the antenna connection terminal 60. In addition, an inductance element 31 (a first inductance element) is connected in series in a connection path between the common connection terminal 50 and the antenna connection terminal 60. Note that the inductance element 31 may be included in the multiplexer 1, or may be externally connected to the multiplexer 1.

The transmission-side filter 11 is a non-balanced input and non-balanced output band pass filter that inputs a transmission wave generated by a transmitting circuit (for example, an RFIC) via the transmission input terminal 10, filter the transmission wave in a transmission pass band (about 1850-1915 MHz: a first pass band) of Band25, and output the filtered transmission wave to the common connection terminal 50.

The reception-side filter 12 is a non-balanced input and non-balanced output band pass filter that inputs a reception wave inputted from the common connection terminal 50, filter the reception wave in a reception pass band (about 1930-1995 MHz: a second pass band) of Band25, and output the filtered reception wave to the reception output terminal 20. The inductance element 21 is connected in series between the reception-side filter 12 and the common connection terminal 50. By the inductance element 21 being connected to the common connection terminal 50 side of the reception-side filter 12, the impedance of the transmission-side filters 11 and 13 and the reception-side filter 14 whose pass bands are bands outside the pass band of the reception-side filter 12, becomes inductive.

The transmission-side filter 13 is a non-balanced input and non-balanced output band pass filter that inputs a transmission wave generated by a transmitting circuit (for example, an RFIC) via the transmission input terminal 30, filter the transmission wave in a transmission pass band (about 1710-1780 MHz: a third pass band) of Band66, and output the filtered transmission wave to the common connection terminal 50.

The reception-side filter 14 is a non-balanced input and non-balanced output band pass filter that inputs a reception wave inputted from the common connection terminal 50, filter the reception wave in a reception pass band (about 2110-2200 MHz: a fourth pass band) of Band66, and output the filtered reception wave to the reception output terminal 40.

The transmission-side filters 11 and 13, and the reception-side filter 14 are directly connected to the common connection terminal 50.

2. Structure of Surface Acoustic Wave Resonator

Here, the structure of a surface acoustic wave resonator defining the transmission-side filters 11 and 13 and the reception-side filters 12 and 14 will be described.

FIGS. 2A to 2C is a general diagram showing a resonator of a surface acoustic wave filter according to the present preferred embodiment; to be specific, FIG. 2A is a plan view, and FIGS. 2A and 2C are cross-sectional views taken along a dot-dash line in FIG. 2A. In FIGS. 2A to 2C, the plan view and the cross-sectional views showing the structure of a serial arm resonator of the transmission-side filter 11 are shown as an example, among a plurality of resonators defining the transmission-side filters 11 and 13 and the reception-side filters 12 and 14. Note that the serial arm resonator shown in FIGS. 2A to 2C is provided to describe the typical structure of the plurality of resonators described above, and the number, the length, and the like of electrode fingers defining an electrode are not limited thereto.

A resonator 100 defining the transmission-side filters 11 and 13 and the reception-side filters 12 and 14 includes a piezoelectric substrate 5 and comb-shaped electrodes 101a and 101b having a comb shape.

As shown in FIG. 2A, a pair of the comb-shaped electrodes 101a and 101b opposing each other is provided on the piezoelectric substrate 5. The comb-shaped electrode 101a includes a plurality of electrode fingers 110a arranged in parallel or substantially in parallel to each other and a bus bar electrode 111a connecting the plurality of electrode fingers 110a. The IDT electrode 101b includes a plurality of electrode fingers 110b arranged in parallel or substantially in parallel to each other and a bus bar electrode 111b connecting the plurality of electrode fingers 110b. The plurality of electrode fingers 110a and the plurality of electrode fingers 110b are provided along a direction orthogonal or substantially orthogonal to an X-axis direction.

Further, as shown in FIG. 2B, an IDT (InterDigital Transducer) electrode 54 including the plurality of electrode fingers 110a and 110b and the bus bar electrodes 111a and 111b has a laminated structure including a close contact layer 541 and a main electrode layer 542.

The close contact layer 541 significantly improves adhesion between the piezoelectric substrate 5 and the main electrode layer 542, and Ti is preferably used as a material, for example. The film thickness of the close contact layer 541 is preferably, for example, about 12 nm.

As a material of the main electrode layer 542, Al including Cu in an amount of 1% is preferably used, for example. The film thickness of the main electrode layer 542 is preferably, for example, about 162 nm.

A protective layer 55 is provided so as to cover the comb-shaped electrodes 101a and 101b. The protective layer 55 protects the main electrode layer 542 from an external environment, adjusts frequency-temperature characteristics, significantly improving moisture resistance and the like, and is a film preferably including, for example, silicon dioxide as a main ingredient. The thickness of the protective layer 55 is preferably, for example, about 25 nm.

Note that materials defining the close contact layer 541, the main electrode layer 542, and the protective layer 55 are not limited to the materials described above. Further, the IDT electrode 54 may not have the above-described laminated structure. The IDT electrode 54 may preferably be made of, for example, a metal such as Ti, Al, Cu, Pt, Au, Ag or Pd, or an alloy of these metals; or may be made of a plurality of multilayer bodies including the above metal or alloy. Note that the protective layer 55 may not be provided.

Next, a laminated structure of the piezoelectric substrate 5 will be described.

As shown in FIG. 2C, the piezoelectric substrate 5 includes a high acoustic-velocity support substrate 51, a low acoustic-velocity film 52 and a piezoelectric film 53, and has a structure in which the high acoustic-velocity support substrate 51, the low acoustic-velocity film 52 and the piezoelectric film 53 are layered in that order.

The piezoelectric film 53 is preferably made of, for example, an about 50° Y-cut X-propagation LiTaO$_3$ piezoelectric single crystal or piezoelectric ceramics (a lithium tantalate single crystal being cut at a surface whose normal line is an axis rotated about the X-axis by 50 degrees from the Y-axis or ceramics, that is, a single crystal or ceramics in which a surface acoustic wave propagates in the X-axis direction). For example, the piezoelectric film 53 preferably has a thickness of about 600 nm. For the transmission-side filter 13 and the reception-side filter 14, the piezoelectric film 53 made of an about 42° to about 45° Y-cut X-propagation LiTaO$_3$ piezoelectric single crystal or piezoelectric ceramics is preferably used.

The high acoustic-velocity support substrate 51 is a substrate that supports the low acoustic-velocity film 52, the piezoelectric film 53 and the IDT electrode 54. In addition, the high acoustic-velocity support substrate 51 is a substrate such that an acoustic velocity of a bulk wave propagating in the high acoustic-velocity support substrate 51 is larger than an acoustic velocity of a surface acoustic wave, a boundary acoustic wave, or the like propagating in the piezoelectric film 53, and confines a surface acoustic wave in a portion where the piezoelectric film 53 and the low acoustic-velocity film 52 are laminated and prevent the surface acoustic wave from leaking to a lower side from the high acoustic-velocity support substrate 51. The high acoustic-velocity support substrate 51 is preferably, for example, a silicon substrate, and preferably has a thickness of, for example, about 200 µm.

The low acoustic-velocity film 52 is a film such that an acoustic velocity of a bulk wave propagating in the low acoustic-velocity film 52 is smaller than an acoustic velocity of a bulk wave propagating in the piezoelectric film 53, and is located between the piezoelectric film 53 and the high acoustic-velocity support substrate 51. Due to this structure and due to the property of the acoustic wave that its energy is inherently concentrated on a low acoustic-velocity medium, leakage of the surface acoustic wave energy to the outside of the IDT electrode is significantly reduced or prevented. The low acoustic-velocity film 52 is a film preferably including, for example, silicon dioxide as a main ingredient, and preferably has a thickness of, for example, about 670 nm.

According to the above laminated structure of the piezoelectric substrate 5, it is possible to greatly increase the Q value at a resonant frequency and at an anti-resonant frequency as compared with the existing structure in which a piezoelectric substrate is used as a single layer. In other words, since a surface acoustic wave resonator with a high Q value can be configured, it is possible to provide a filter with a small insertion loss by using the surface acoustic wave resonator.

Further, as in the case where the inductance element 21 for impedance matching is connected in series to the common connection terminal 50 side of the reception-side filter 12, circuit elements, for example, an inductance element and a capacitance element are added in order to achieve the impedance matching between the plurality of surface acoustic wave filters. Thus, it is assumed that the Q value of the resonator 100 is equivalently reduced. However, even in such a case, according to the above-described laminated structure of the piezoelectric substrate 5, the Q value of the resonator 100 can be maintained at a high value. Accordingly, it is possible to provide a surface acoustic wave filter having a low loss property within the band.

Note that the high acoustic-velocity support substrate 51 may have a structure in which a support substrate and a high acoustic-velocity film in which a bulk wave propagates at a higher acoustic velocity than an acoustic velocity of a surface acoustic wave, a boundary acoustic wave, or the like propagating in the piezoelectric film 53 are layered. In this case, the following can preferably be used for the support substrate: a piezoelectric material, for example, lithium tantalate, lithium niobate or quartz; a dielectric material such various ceramics, for example, sapphire, alumina, magnesia, silicon nitride, aluminum nitride, silicon carbide, zirconia, cordierite, mullite, steatite, forsterite or glass; or a semiconductor, for example, silicon or gallium nitride; and a resin substrate or the like. Further, for the high acoustic-velocity film, various high acoustic-velocity materials as follows can be used: aluminum nitride, aluminum oxide, silicon carbide, silicon nitride, silicon oxynitride, a DLC film or diamond, a medium including the above-cited material as a main ingredient, a medium including a mixture of the above materials as a main ingredient, and the like.

In FIGS. 2A and 2B, X represents a repetition pitch of the plurality of electrode fingers 110a and 110b defining the comb-shaped electrodes 101a and 101b, L represents an intersection width of the comb-shaped electrodes 101a and 101b, W represents a width of the electrode fingers 110a and 110b, S represents a width of a space between the electrode finger 110a and the electrode finger 110b, and h represents a height of the comb-shaped electrodes 101a and 101b.

3. Configurations of Filters and Inductance Elements]

3-1. Circuitry of Transmission-Side Filters

Hereinafter, circuitry of each of the filters will be described with reference to FIG. 3A to FIG. 4.

Figure 3A:
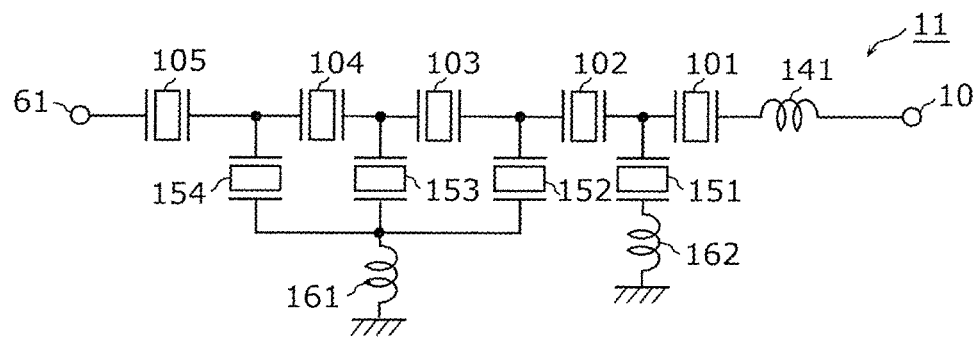
FIG. 3A is a circuit diagram of a transmission-side filter of Band25 defining a multiplexer according to a preferred embodiment of the present invention.

FIG. 3A is a circuit diagram of the transmission-side filter 11 of Band25 defining the multiplexer 1 according to the present preferred embodiment. As shown in FIG. 3A, the transmission-side filter 11 includes serial arm resonators 101 to 105, parallel arm resonators 151 to 154 and inductance elements for matching 141, 161 and 162.

The serial arm resonators 101 to 105 are connected in series to each other between the transmission input terminal 10 and a transmission output terminal 61. The parallel arm resonators 151 to 154 are connected in parallel to each other between a reference terminal (ground) and each of connection points of the transmission input terminal 10, the transmission output terminal 61, and the serial arm resonators 101 to 105. With the above connections of the serial arm resonators 101 to 105 and the parallel arm resonators 151 to 154, the transmission-side filter 11 defines a ladder band pass filter.

The inductance element 141 is connected in series between the transmission input terminal 10 and the serial arm resonator 101. The transmission-side filter 11 has the inductance element 141 connected in series to the transmission input terminal 10, which is positioned on the opposite side to the common connection terminal 50 connected to the antenna element 2. Note that the inductance element 141 may be connected in parallel with the transmission input terminal 10, that is, connected between the reference terminal and a connection path between the transmission input terminal 10 and the serial arm resonator 101. Including the inductance element 141 makes it possible to increase a level of isolation of the transmission-side filter 11 by making use of coupling of the inductance element 141 with the other inductance elements 161 and 162.

The inductance element 161 is connected between the reference terminal and a connection point of the parallel arm resonators 152, 153, and 154. The inductance element 162 is connected between the parallel arm resonator 151 and the reference terminal.

The transmission output terminal 61 is connected to the common connection terminal 50 (see FIG. 1). Further, the transmission output terminal 61 is connected to the serial arm resonator 105 and is not directly connected to any of the parallel arm resonators 151 to 154.

Figure 3B:
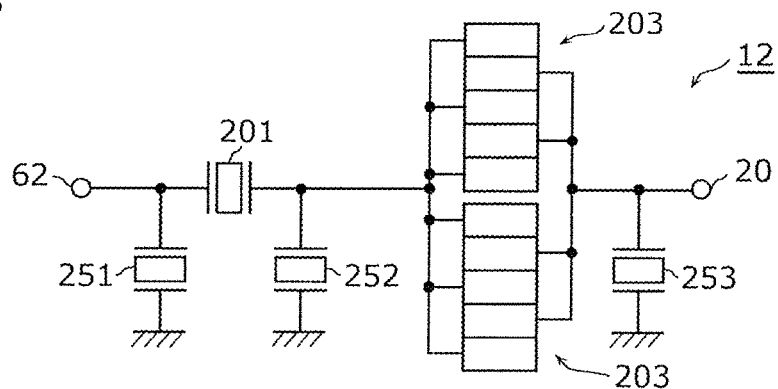
FIG. 3B is a circuit diagram of a reception-side filter of Band25 defining a multiplexer according to a preferred embodiment of the present invention.
Figure 3C:
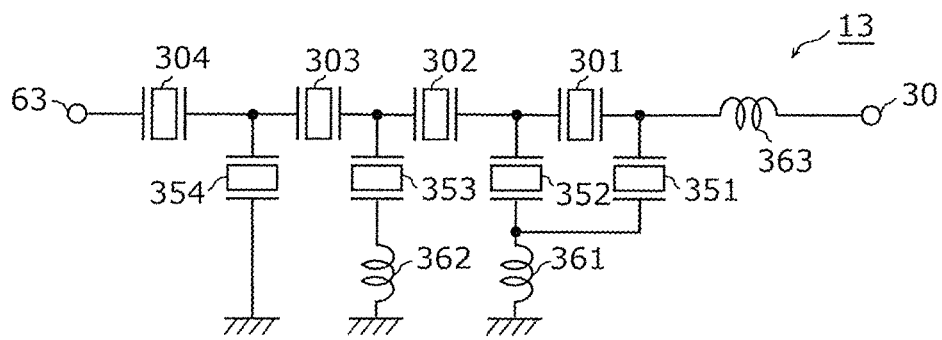
FIG. 3C is a circuit diagram of a transmission-side filter of Band66 defining a multiplexer according to a preferred embodiment of the present invention.

FIG. 3C is a circuit diagram of the transmission-side filter 13 of Band66 defining the multiplexer 1 according to the present preferred embodiment. As shown in FIG. 3C, the transmission-side filter 13 includes serial arm resonators 301 to 304, parallel arm resonators 351 to 354, and inductance elements for matching 361 to 363.

The serial arm resonators 301 to 304 are connected in series to each other between the transmission input terminal 30 and a transmission output terminal 63. The parallel arm resonators 351 to 354 are connected in parallel to each other between the reference terminal (ground) and each of connection points of the transmission input terminal 30, the transmission output terminal 63, and the serial arm resonators 301 to 304. With the above connections of the serial arm resonators 301 to 304 and the parallel arm resonators 351 to 354, the transmission-side filter 13 defines a ladder band pass filter. The inductance element 361 is connected between the reference terminal and a connection point of the parallel arm resonators 351 and 352. The inductance element 362 is connected between the parallel arm resonator 353 and the reference terminal. The inductance element 363 is connected between the transmission input terminal 30 and the serial arm resonator 301. The inductance element 363 may be connected in parallel with the transmission input terminal 30, that is, connected between the reference terminal and a connection path between the transmission input terminal 30 and the serial arm resonator 301.

The transmission output terminal 63 is connected to the common connection terminal 50 (see FIG. 1). Further, the transmission output terminal 63 is connected to the serial arm resonator 304 and is not directly connected to any of the parallel arm resonators 351 to 354.

3-2. Circuitry of Reception-Side Filters

FIG. 3B is a circuit diagram of the reception-side filter 12 of Band25 defining the multiplexer 1 according to the present preferred embodiment. As shown in FIG. 3B, the reception-side filter 12 includes, for example, a longitudinally coupled surface acoustic wave filter section. More specifically, the reception-side filter 12 includes a longitudinally coupled filter section 203, a serial arm resonator 201 and parallel arm resonators 251 to 253.

Figure 4:
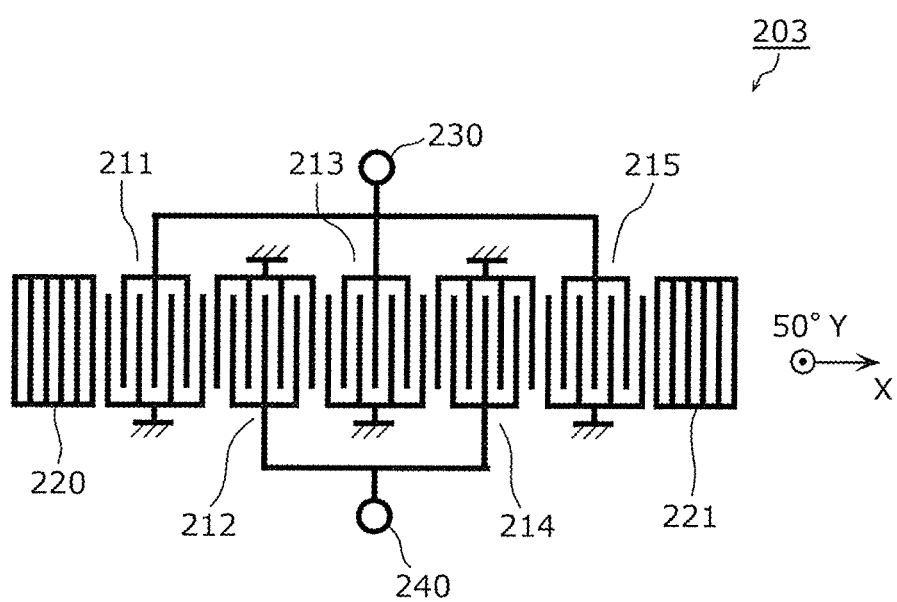
FIG. 4 is a plan view showing an electrode configuration of a longitudinally coupled surface acoustic wave filter according to a preferred embodiment of the present invention.

FIG. 4 is a plan view showing an electrode configuration of the longitudinally coupled filter section 203 according to the present preferred embodiment. As shown in FIG. 4, the longitudinally coupled filter section 203 includes IDTs 211 to 215, reflectors 220 and 221, an input port 230, and an output port 240.

Each of the IDTs 211 to 215 includes a pair of IDT electrodes opposing each other. The IDTs 212 and 214 sandwich the IDT 213 in the X-axis direction, and the IDTs 211 and 215 sandwich the IDTs 212 to 214 in the X-axis direction. Further, the IDTs 211, 213 and 215 are connected in parallel between the input port 230 and the reference terminal (ground), and the IDTs 212 and 214 are connected in parallel between the output port 240 and the reference terminal.

Further, as shown in FIG. 3B, the serial arm resonator 201 and the parallel arm resonators 251, 252 define a ladder filter section.

A reception input terminal 62 is connected to the common connection terminal 50 (see FIG. 1) via the inductance element 21 (see FIG. 1). Further, as shown in FIG. 3B, the reception input terminal 62 is connected to the parallel arm resonator 251.

Figure 3D:
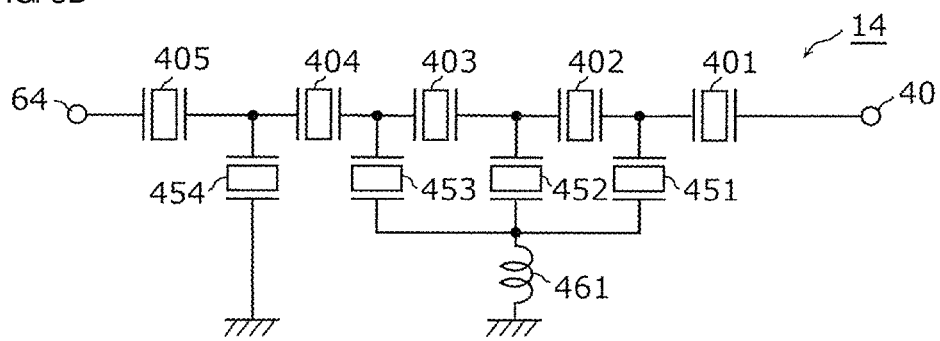
FIG. 3D is a circuit diagram of a reception-side filter of Band66 defining a multiplexer according to a preferred embodiment of the present invention.

FIG. 3D is a circuit diagram of the reception-side filter 14 of Band66 defining the multiplexer 1 according to the present preferred embodiment. As shown in FIG. 3D, the reception-side filter 14 includes serial arm resonators 401 to 405, parallel arm resonators 451 to 454, and an inductance element for matching 461.

The serial arm resonators 401 to 405 are connected in series to each other between the reception output terminal 40 and a reception input terminal 64. The parallel arm resonators 451 to 454 are connected, in parallel to each other, between the reference terminal (ground) and connection points of the reception output terminal 40, the reception input terminal 64, and the serial arm resonators 401 to 405. With the above connections of the serial arm resonators 401 to 405 and the parallel arm resonators 451 to 454, the reception-side filter 14 defines a ladder band pass filter. The inductance element 461 is connected between the reference terminal and a connection point of the parallel arm resonators 451, 452 and 453.

The reception input terminal 64 is connected to the common connection terminal 50 (see FIG. 1). Further, as shown in FIG. 3D, the reception input terminal 64 is connected to the serial arm resonator 405 and is not directly connected to the parallel arm resonator 454.

The arrangement of the resonators and circuit elements in the surface acoustic wave filter included in the multiplexer 1 according to the present preferred embodiment is not limited to the arrangement shown by the transmission-side filters 11 and 13 and the reception-side filters 12 and 14 according to the present preferred embodiment discussed above. The arrangement of the resonators and circuit elements in the above-discussed surface acoustic wave filter differs depending on the specifications of the bandpass characteristics in each frequency band (Band). The above-mentioned "arrangement" refers to, for example, the number of serial and parallel arm resonators and the selection of a filter, for example, a ladder filter or a longitudinally coupled filter.

Here, the multiplexer 1 according to the present preferred embodiment includes (1) at least three acoustic wave filters, (2) an input terminal or an output terminal of each of the at least three acoustic wave filters is connected to, among a plurality of terminals provided on a piezoelectric substrate defining each of the filters, an antenna terminal connected to an antenna connection terminal, (3) the at least three acoustic wave filters include a first acoustic wave filter and a second acoustic wave filter located at a farther position from the antenna connection terminal than a position of the first acoustic wave filter in a plan view of a substrate 6 (see FIG. 5A) and (4) among the plurality of terminals provided on the piezoelectric substrate, a terminal located at the closest position to the antenna connection terminal is connected to the second acoustic wave filter as the antenna terminal.

In other words, as described below, the multiplexer 1 according to the present preferred embodiment includes the transmission-side filter 11 and the reception-side filter 14 (first acoustic wave filter) mounted on the substrate 6, and the reception-side filter 12 and the transmission-side filter 13 (second acoustic wave filter) that are located at a farther position than that of the transmission-side filter 11 and the reception-side filter 14 from the antenna connection terminal 60 in a plan view of the substrate 6. Then, among the plurality of terminals provided in each of the reception-side filter 12 and the transmission-side filter 13, the antenna terminal of each of the reception-side filter 12 and the transmission-side filter 13 is located at a position closest to the antenna connection terminal 60.

Hereinafter, each filter of the multiplexer 1, and the arrangement of the antenna connection terminal 60 and the antenna terminal of each filter will be described.

3-3. Arrangement of Multiplexer

Figure 5A:
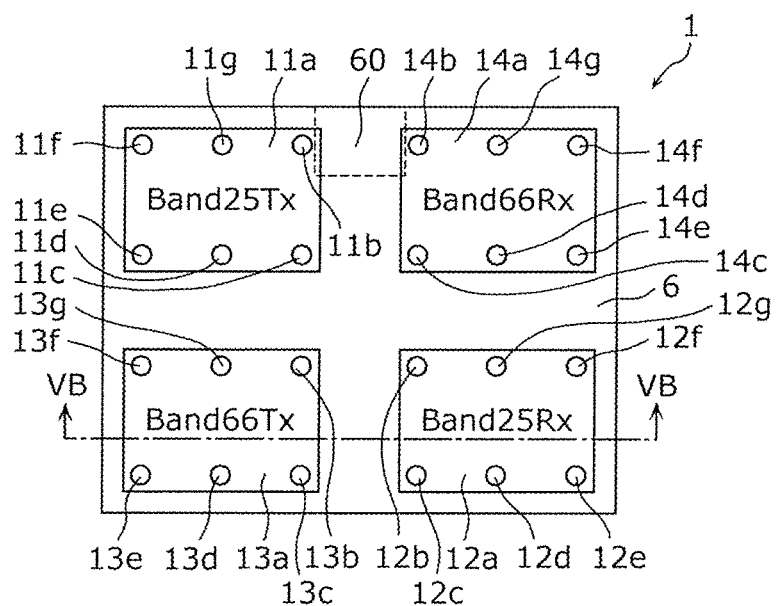
FIG. 5A is a plan view showing an example of an arrangement of a transmission-side filter and a reception-side filter of a multiplexer according to a preferred embodiment of the present invention.
Figure 5B:
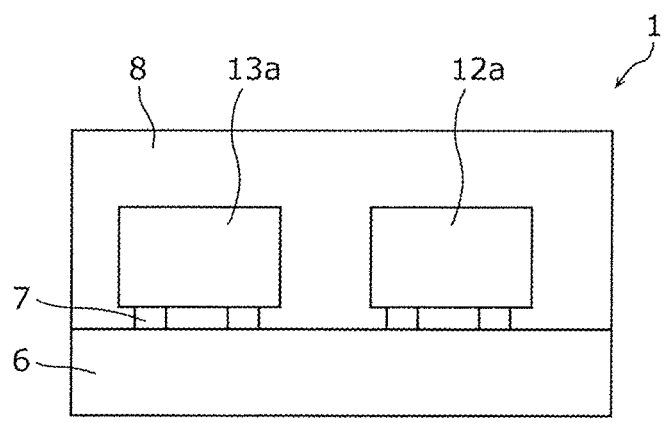
FIG. 5B is a cross-sectional view showing an example of an arrangement of a transmission-side filter and a reception-side filter of a multiplexer according to a preferred embodiment of the present invention.

FIG. 5A is a plan view showing an example of the arrangement of the transmission-side filters 11 and 13 and the reception-side filters 12 and 14 of the multiplexer according to the present preferred embodiment. FIG. 5B is a cross-sectional view showing an example of the arrangement of the transmission-side filters 11 and 13 and the reception-side filters 12 and 14 of the multiplexer 1 according to the present preferred embodiment. FIG. 5B is a cross-sectional view taken along a VB-VB line in FIG. 5A.

Of the transmission-side filters 11 and 13 and the reception-side filters 12 and 14, corresponding to one end of the above one surface of the substrate 6 where the antenna connection terminal 60 is provided, the transmission-side filter 11 and the reception-side filter 14 are disposed at a side near one end of the other surface of the substrate. Furthermore, on the substrate 6, the transmission-side filter 13 and the reception-side filter are disposed at a farther position than that of the transmission-side filter 11 and the reception-side filter 14 from the antenna connection terminal 60. The transmission-side filter 11 and the reception-side filter 14 define and function as the first acoustic wave filter, and the transmission-side filter 13 and the reception-side filter 12 define and function as the second acoustic wave filter.

As shown in FIGS. 5A and 5B, in the multiplexer 1, piezoelectric substrates 11a and 13a respectively defining the transmission-side filters 11 and 13, and piezoelectric substrates 12a and 14a respectively defining the reception-side filters 12 and 14 are mounted on the substrate 6. Note that the transmission-side filters 11 and 13 and the reception-side filters 12 and 14 are not limited to the above-described arrangement relationship, and may be arranged so as to have other arrangement relationships.

Terminals 11b to 11g are provided on the piezoelectric substrate 11a. Similarly, terminals 12b to 12g are provided on the piezoelectric substrate 12a. Terminals 13b to 13g are provided on the piezoelectric substrate 13a. Terminals 14b to 14g are provided on the piezoelectric substrate 14a.

Among the piezoelectric substrates 11a, 12a, 13a and 14a, in the piezoelectric substrates 11a and 14a that are disposed at the side near the one end of the substrate 6 where the antenna connection terminal 60 is provided, the terminals 11b and 14b disposed at the closest position to the antenna connection terminal 60 are the antenna terminals connected to the antenna connection terminal 60 via a wiring, or the like.

In the piezoelectric substrates 13a and 12a disposed at a farther position than that of the piezoelectric substrates 11a and 14a from the antenna connection terminal 60, the terminals 13b and 12b disposed at the closest position to the antenna connection terminal 60 are the antenna terminals connected to the antenna connection terminal 60 via a wiring or the like. The terminals 11e, 12e, 13e and 14e are terminals connected to the transmission input terminal 10, the reception output terminal 20, the transmission input terminal 30 and the reception output terminal 40, respectively.

The piezoelectric substrates 11a, 12a, 13a, and 14a are mounted on the substrate 6 with solder 7, as shown in FIG. 5B. Further, as shown in FIG. 5B, a sealing resin 8 is disposed on the substrate 6 and covers the piezoelectric substrates 11a, 12a, 13a, and 14a. The sealing resin 8 includes, for example, a thermosetting resin or an ultraviolet curable resin.

The substrate 6 has a structure in which a plurality of layers of printed circuit substrates are laminated. Wiring patterns and vias are provided in the plurality of layers of printed circuit substrates.

Figure 6A:
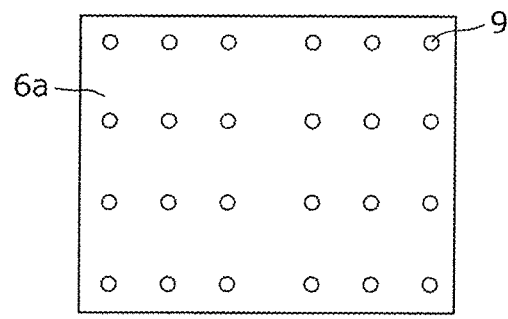
FIG. 6A is a plan view showing a first layer of a substrate of a multiplexer according to a preferred embodiment of the present invention.
Figure 6B:
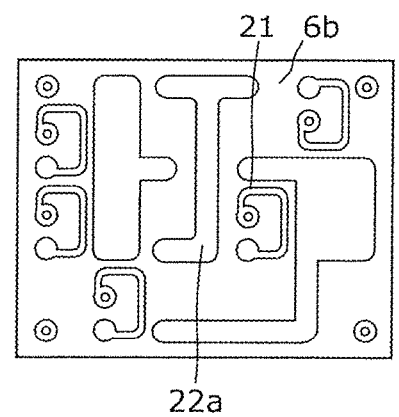
FIG. 6B is a plan view showing a second layer of a substrate of a multiplexer according to a preferred embodiment of the present invention.
Figure 6C:
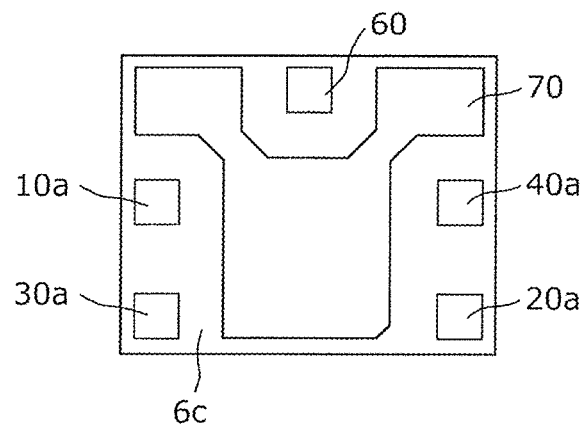
FIG. 6C is a plan view showing a third layer of a substrate of a multiplexer according to a preferred embodiment of the present invention.

FIG. 6A is a plan view of a first layer of the substrate of the multiplexer according to the present preferred embodiment. FIG. 6B is a plan view of a second layer of the substrate of the multiplexer according to the present preferred embodiment. FIG. 6C is a plan view of a third layer of the substrate of the multiplexer according to the present preferred embodiment.

The substrate 6 includes, for example, a first layer 6a, a second layer 6b, and a third layer 6c, as shown in FIGS. 6A to 6C. The first layer 6a is the uppermost layer of the substrate 6 where the transmission-side filters 11 and 13 and the reception-side filters 12 and 14 are mounted, the third layer 6c is the lowermost layer of the substrate 6 provided on the opposite side to the side where the first layer 6a is provided, and the second layer 6b is one of a plurality of layers provided between the first layer 6a and the third layer 6c.

A plurality of terminals 9 are provided in the first layer 6a. These terminals 9 are terminals to which the transmission-side filters 11 and 13 and the reception-side filters 12 and 14 are mounted. The terminals 9 are each connected to at least any one of wiring patterns and terminals provided in the plurality of layers provided between the first layer 6a and the third layer 6c or provided in the third layer 6c, with vias (not shown).

The inductance element 21 and wiring 22a are provided in the second layer 6b. The wiring 22a is connected to the terminal 13b shown in FIG. 5A by a via. Further, the wiring 22a is connected to the terminal 12b shown in FIG. 5A via the inductance element 21 and a via. Note that the inductance element 21 is defined by the second layer 6b and a layer (not shown) adjacent to the second layer 6b. In the third layer 6c, there are provided terminals 10a, 20a, 30a and 40a, to which the transmission input terminal 10, the reception output terminal 20, the transmission input terminal 30, and the reception output terminal 40 are connected via the terminals 11e, 12e, 13e and 14e, other wirings, and the like. In addition, a ground terminal 70 connected to the antenna connection terminal 60 and the ground is provided in the third layer 6c. The antenna connection terminal 60 is disposed in the third layer 6c so as to be adjacent to or in a vicinity of one end of the substrate 6. The ground terminal 70 is so disposed as to separate the antenna connection terminal 60, the terminals 10a and 30a, and the terminals 20a and 40a from each other.

Further, the antenna connection terminal 60 disposed in the third layer 6c is connected to the wiring 22a in the second layer 6b by a via and the inductance element 31 (not shown). Note that the inductance element 31 is provided in a layer (not shown) disposed between the second layer 6b and the third layer 6c. In other words, the terminals 13b and 12b, which are the antenna terminals of the transmission-side filter 13 and the reception-side filter 12, are common-connected by the wiring 22a, and connected to the antenna connection terminal 60. The wiring 22a is provided only in the second layer 6b. That is, the wiring 22a connecting the terminals 13b and 12b, which are the antenna terminals, and the antenna connection terminal 60 is provided in a single layer. With this, it is possible to shorten the length of the wiring connecting the terminals 13b and 12b as the antenna terminals and the antenna connection terminal 60.

Note that the terminals 13b and 12b of the transmission-side filter 13 and the reception-side filter 12 are connected on the substrate 6 and then connected to the common connection terminal 50 (shown in FIG. 1). In FIG. 6B, a formation region of the wiring 22a is divided into an upper wiring region and a lower wiring region in an alignment direction of the transmission-side filters 11 and 13 (or in an alignment direction of the reception-side filters 12 and 14). In this case, the common connection terminal 50 shown in FIG. 1 corresponds to the upper wiring region closer to the antenna connection terminal 60 among the upper wiring region and the lower wiring region of the wiring 22a in FIG. 6B.

Thus, in a case where a plurality of second acoustic wave filters (transmission-side filters 13 and reception-side filters 12) are provided, by common-connecting the antenna terminals of the plurality of second acoustic wave filters (terminals 13b and terminals 12b), a total length of the wiring connecting the respective antenna terminals of the plurality of second acoustic wave filters and the antenna connection terminal 60 can be shortened as compared with a case where the respective antenna terminals of the plurality of second acoustic wave filters are separately connected to the antenna connection terminal 60. This makes it possible to further reduce the insertion loss of the multiplexer 1.

In addition, the substrate 6 may further incorporate inductance elements, other wirings, and terminals that define the transmission-side filters 11 and 13 and the reception-side filter 14.

Figure 7A:
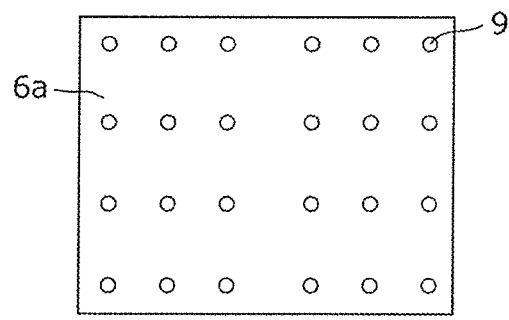
FIG. 7A is a plan view showing a first layer of a substrate of a multiplexer according to a comparative example.
Figure 7B:
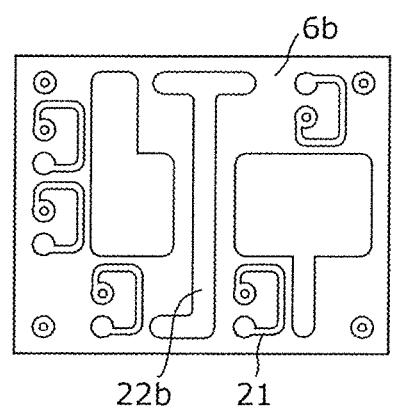
FIG. 7B is a plan view showing a second layer of a substrate of a multiplexer according to a comparative example.
Figure 7C:
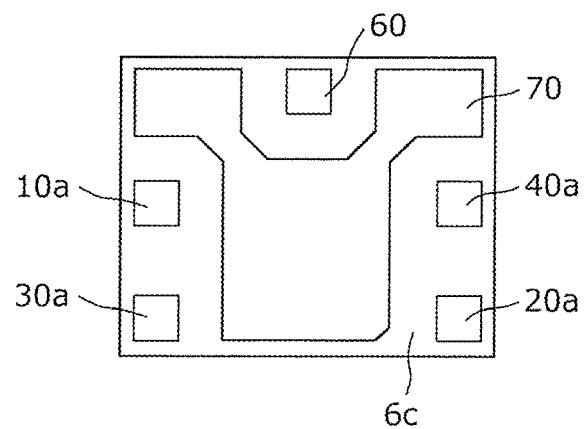
FIG. 7C is a plan view showing a third layer of a substrate of a multiplexer according to a comparative example.

FIG. 7A is a plan view of a first layer of a substrate of a multiplexer according to a comparative example. FIG. 7B is a plan view of a second layer of the substrate of the multiplexer according to the comparative example. FIG. 7C is a plan view of a third layer of the substrate of the multiplexer according to the comparative example.

In the multiplexer according to the comparative example, the terminals 13c and 12c shown in FIG. 5A are antenna terminals connected to the antenna connection terminal 60, in the piezoelectric substrates 13a and 12a defining the transmission-side filter 13 and the reception-side filter 12. In the multiplexer according to the comparative example, a first layer 6a and a third layer 6c of the substrate 6 are the same or substantially the same as the first layer 6a and the third layer 6c of the multiplexer according to the preferred embodiment. On the other hand, as shown in FIG. 7B, a second layer 6b includes a wiring 22b having a length longer than that of the wiring 22a. Then, the wiring 22b is connected to the terminal 13c shown in FIG. 5A by a via. Further, the wiring 22b is connected to the terminal 12c shown in FIG. 5A by the inductance element 21 and a via. Note that the inductance element 21 is defined by the second layer 6b and a layer (not shown) adjacent to the second layer 6b.

To rephrase, in the multiplexer 1 according to the present preferred embodiment, the length of the wiring 22a, to which the terminals 13b and 12b as the antenna terminals are connected, is made shorter than the length of the wiring 22b of the multiplexer according to the comparative example. Accordingly, it is possible to reduce the capacitance generated between the wiring 22a and the ground terminal 70. This makes it possible to reduce the insertion loss in the pass bands of the transmission-side filters 11 and 13 and the reception-side filters 12 and 14.

Note that the wiring 22a, to which the terminals 12b and 12b as the antenna terminals are connected, is not limited to being provided in the second layer 6b, and may be provided in the first layer 6a where the transmission-side filters 11 and 13 and the reception-side filters 12 and 14 are mounted. In this case, as compared with a case where the wiring 22a is provided in another layer, a distance between the terminals 13b and 12b and the wiring 22a to be common-connected can be shortened, so that a total length of the wiring from the terminals 13b and 12b to the antenna connection terminal 60 can be shortened. This makes it possible to further reduce the insertion loss in the pass bands of the transmission-side filters 11 and 13 and the reception-side filters 12 and 14.

In addition, the transmission-side filters 11 and 13 and the reception-side filters 12 and 14 may each be defined by a single chip, or at least two filters among the transmission-side filters 11 and 13 and the reception-side filters 12 and 14 may be defined by a single chip.

Further, in the preferred embodiment, not only the antenna terminals 13b and 12b of the transmission-side filter 13 and the reception-side filter 12, which define and function as the second acoustic wave filter, are taken as the terminals disposed at the closest position to the antenna connection terminal 60, but also the antenna terminals 11b and 14b of the transmission-side filter 11 and the reception-side filter 14, which define and function as the first acoustic wave filter, are taken as the terminals disposed at the closest position to the antenna connecting terminal 60. However, in the multiplexer according to the present preferred embodiment of the present invention, although the antenna terminals 13b and 12b of the transmission-side filter 13 and the reception-side filter 12, which define and function as the second acoustic wave filter, are taken as the terminals disposed at the closest position to the antenna connection terminal 60, the antenna terminals 11b and 14b of the transmission-side filter 11 and the reception-side filter 14, which define and function as the first acoustic wave filter, may not be taken as the terminals disposed at the closest position to the antenna connection terminal 60.

In other words, in order to shorten the total distance of the wiring from the antenna connection terminal 60 to each of the filters, the distance of the wiring from a far-side acoustic wave filter (the second acoustic wave filter) having the largest influence on the total distance is shortened, thus making it possible to more effectively shorten the total distance. With this, it is possible to reduce the capacitance generated between the ground and the wiring connecting the antenna terminal of the second acoustic wave filter and the antenna connection terminal, and thus, it is possible to reduce the insertion loss of the multiplexer.

4. Operation Principle of Surface Acoustic Wave Filter

Here, the principle of operation of a ladder surface acoustic wave filter according to the present preferred embodiment will be described.

For example, each of the parallel arm resonators 151 to 154 shown in FIG. 3A has a resonant frequency frp and an anti-resonant frequency fap (>frp) in the resonance characteristics thereof. Further, each of the serial arm resonators 101 to 105 has a resonant frequency frs and an anti-resonant frequency fas (>frs>frp) in the resonance characteristics thereof. The resonant frequencies frs of the serial arm resonators 101 to 105 are preferably designed so as to match or substantially match each other, but do not necessarily match each other. Similarly, the anti-resonant frequencies fas of the serial arm resonators 101 to 105 do not necessarily match each other, the resonant frequencies frp of the parallel arm resonators 151 to 154 do not necessarily match each other, and the anti-resonant frequencies fap of the parallel arm resonators 151 to 154 do not necessarily match each other.

In a case where a band pass filter includes a ladder resonator, the anti-resonant frequency fap of each of the parallel arm resonators 151 to 154 and the resonant frequency frs of each of the serial arm resonators 101 to 105 are brought close to each other. Thus, the vicinity of the resonant frequency frp, in which the impedance of the parallel arm resonators 151 to 154 approaches 0, defines and functions as a lower frequency-side stop region. Further, as the frequency increases therefrom, the impedance of the parallel arm resonators 151 to 154 increases in the vicinity of the anti-resonant frequency fap, and the impedance of the serial arm resonators 101 to 105 approaches 0 in the vicinity of the resonant frequency frs. With this, in the vicinity of the anti-resonant frequency fap to the resonant frequency frs, there is provided a signal passage region in a signal path from the transmission input terminal 10 toward the transmission output terminal 61. Further, when the frequency becomes higher to be close to the anti-resonant frequency fas, the impedance of the serial arm resonators 101 to 105 becomes high and provides a higher frequency-side stop region. In other words, where to set the anti-resonant frequency fas of the serial arm resonators 101 to 105 outside the signal passage region exerts a large influence on the steepness of the attenuation characteristics in the higher frequency-side stop region.

When a high frequency signal is inputted from the transmission input terminal 10 in the transmission-side filter 11, a potential difference is generated between the transmission input terminal 10 and the reference terminal, which causes the piezoelectric substrate 5 to be distorted so that surface acoustic waves propagating in the X-axis direction are generated. Here, by making the pitches λ of the comb-shaped electrodes 101a and 101b match or substantially match the wave length of the pass band, only a high frequency signal including a frequency component that is to be passed through, passes through the transmission-side filter 11.

Hereinafter, high frequency transmission characteristics and impedance characteristics of the multiplexer 1 according to the present preferred embodiment will be described while being compared with the multiplexer according to the comparative example.

5. High Frequency Transmission Characteristics and Impedance Matching of Multiplexer Hereinafter, the high frequency transmission characteristics of the multiplexer 1 according to the present preferred embodiment will be described while being compared with the high frequency transmission characteristics of the multiplexer according to the comparative example described above.

Figure 8:
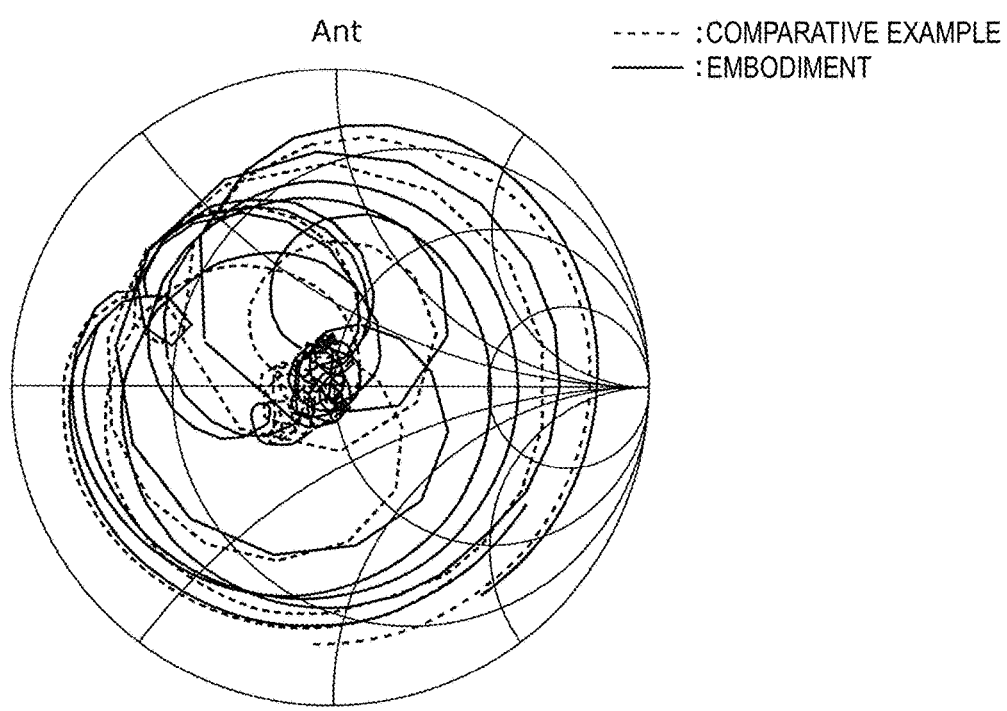
FIG. 8 is a Smith chart showing complex impedance, seen from an antenna connection terminal, of a multiplexer according to a preferred embodiment of the present invention.

First, impedance matching of the overall multiplexer 1 will be described. FIG. 8 is a Smith chart showing complex impedance, seen from the antenna connection terminal 60, of the multiplexer 1 according to the present preferred embodiment.

As shown in FIG. 8, the complex impedance, seen from the antenna connection terminal 60 side, of the multiplexer 1 moves to the right direction of the Smith chart as a whole and approaches the center of the Smith chart, as compared with the case of the multiplexer according to the comparative example. In other words, as compared with the case of the multiplexer according to the comparative example, the complex impedance, seen from the antenna connection terminal 60 side of the multiplexer 1 shifts in the positive direction along the real axis in the Smith chart, and approaches 50Ω. Accordingly, it can be understood that the accuracy of the impedance matching of the multiplexer 1 is significantly improved.

Figure 9A:
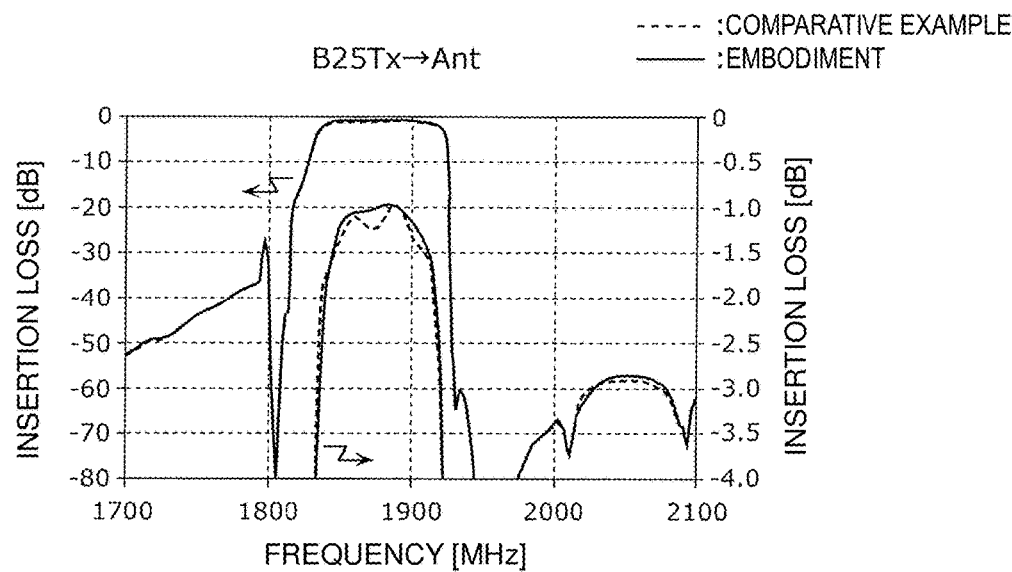
FIG. 9A is a graph comparing bandpass characteristics of transmission-side filters of Band25 according to a preferred embodiment of the present invention and a comparative example.
Figure 9B:
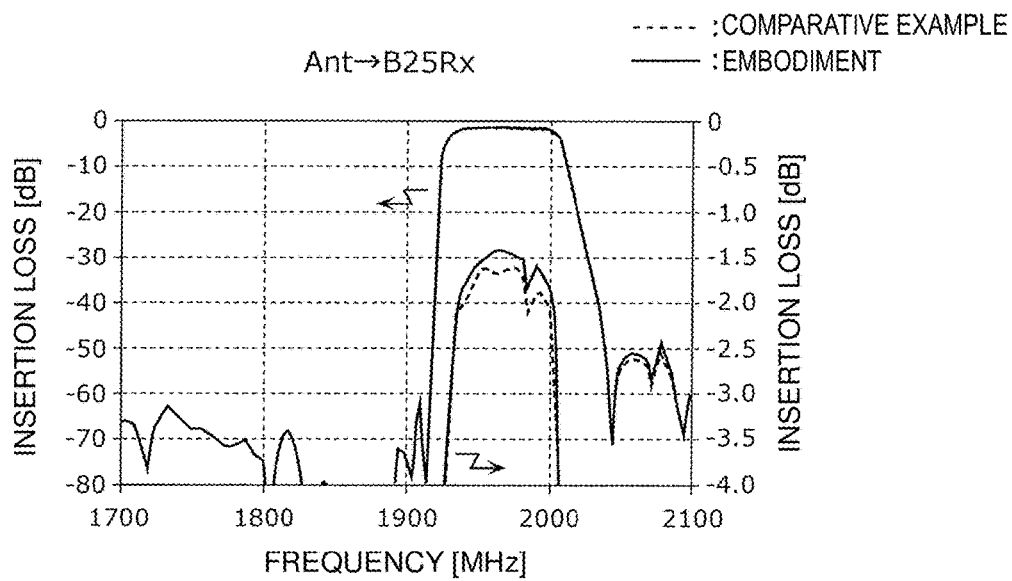
FIG. 9B is a graph comparing bandpass characteristics of reception-side filters of Band25 according to a preferred embodiment of the present invention and a comparative example.
Figure 9C:
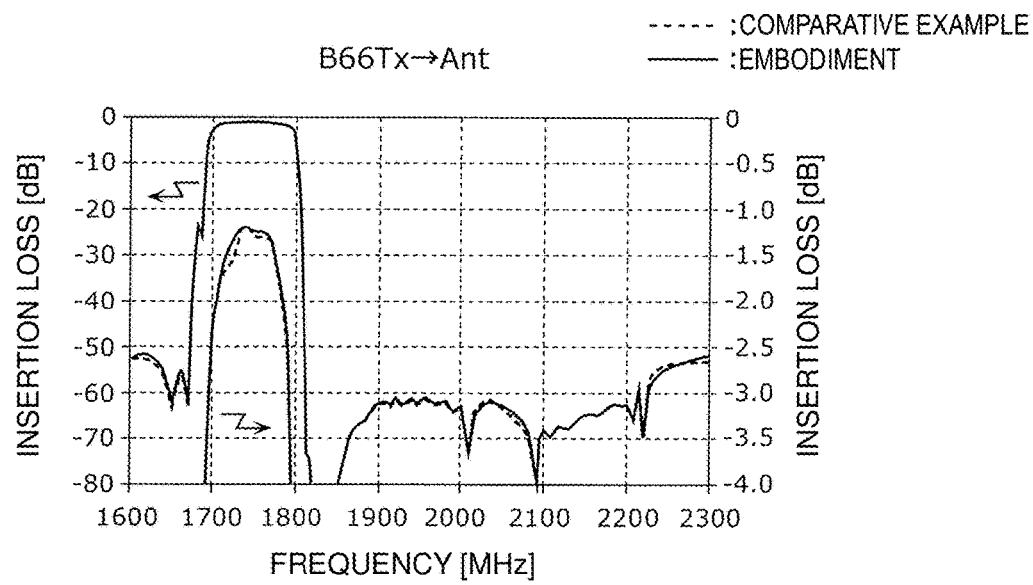
FIG. 9C is a graph comparing bandpass characteristics of transmission-side filters of Band66 according to a preferred embodiment of the present invention and a comparative example.
Figure 9D:
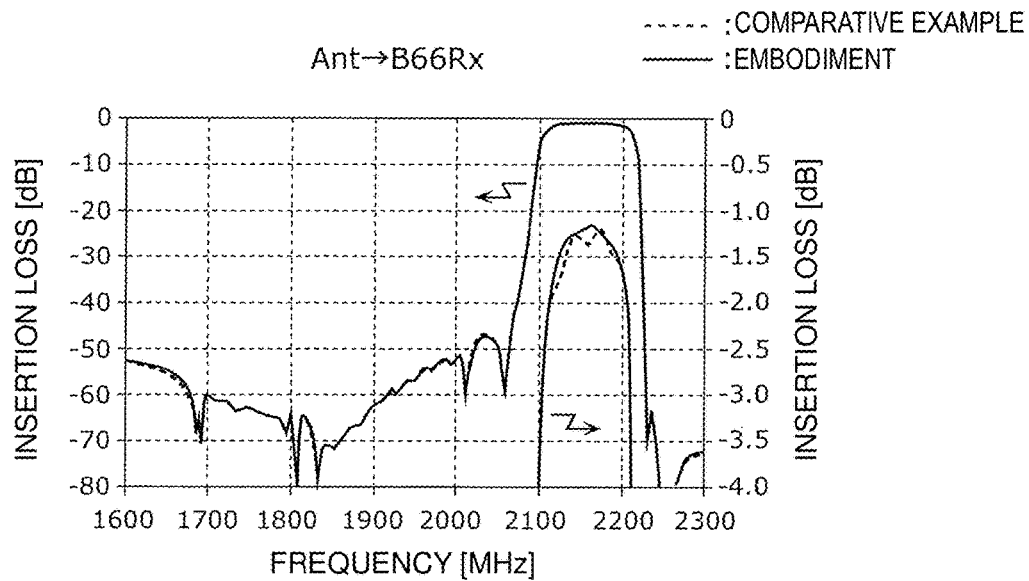
FIG. 9D is a graph comparing bandpass characteristics of reception-side filters of Band66 according to a preferred embodiment of the present invention and a comparative example.

Further, insertion loss of each filter will be described. FIG. 9A is a graph comparing bandpass characteristics of the transmission-side filters 11 of Band25 according to the present preferred embodiment and the comparative example. FIG. 9B is a graph comparing bandpass characteristics of the reception-side filters 12 of Band25 according to the present preferred embodiment and the comparative example. FIG. 9C is a graph comparing bandpass characteristics of the transmission-side filters 13 of Band66 according to the present preferred embodiment and the comparative example. FIG. 9D is a graph comparing bandpass characteristics of the reception-side filters 14 of Band66 according to the present preferred embodiment and the comparative example.

As shown in FIGS. 9A and 9C, when the antenna connection terminal 60 is seen from each of the transmission-side filter 11 of Band25 and the transmission-side filter 13 of Band66, the insertion loss in the pass band of each of the filters of the present preferred embodiment is reduced in comparison with the case of the multiplexer according to the comparative example. Similarly, as shown in FIGS. 9B and 9D, when each of the reception-side filter 12 of Band25 and the reception-side filter 14 of Band66 is seen from the antenna connection terminal 60, the insertion loss in the pass band of each of the filters us also reduced as compared with the case of the multiplexer according to the comparative example. Accordingly, it can be understood that the insertion loss is reduced and the high frequency transmission characteristics are significantly improved in the multiplexer 1 as a whole.

Figure 10A:
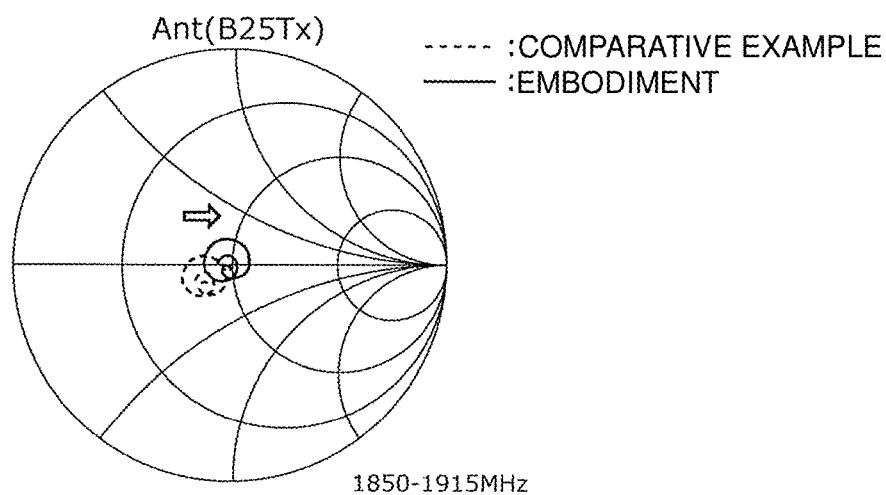
FIG. 10A is a Smith chart showing complex impedance, seen from an antenna connection terminal, of a transmission-side filter of Band25 as a unit according to a preferred embodiment of the present invention.
Figure 10B:
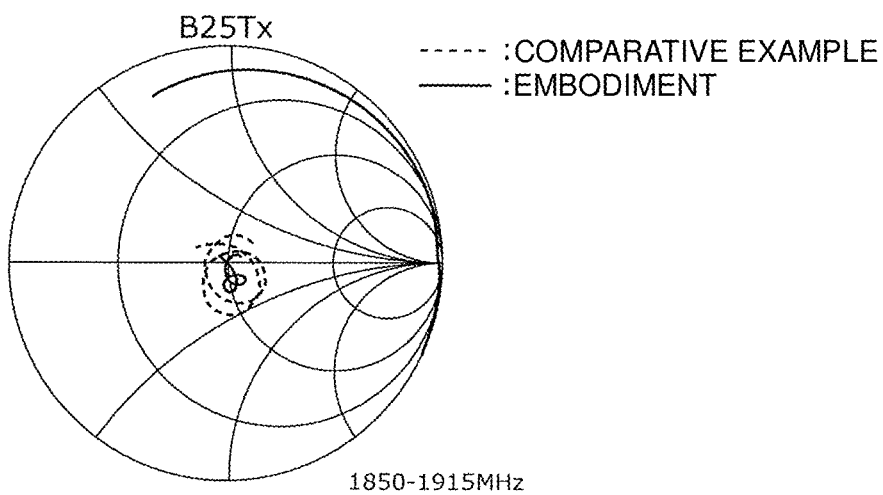
FIG. 10B is a Smith chart showing complex impedance, seen from a transmission output terminal, of a transmission-side filter of Band25 as a unit according to a preferred embodiment of the present invention.
Figure 11A:
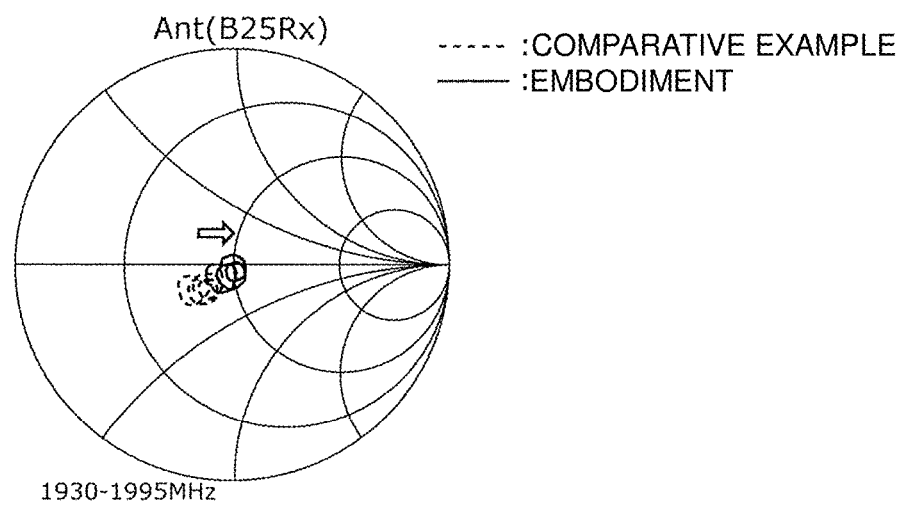
FIG. 11A is a Smith chart showing complex impedance, seen from an antenna connection terminal, of a reception-side filter of Band25 as a unit according to a preferred embodiment of the present invention.
Figure 11B:
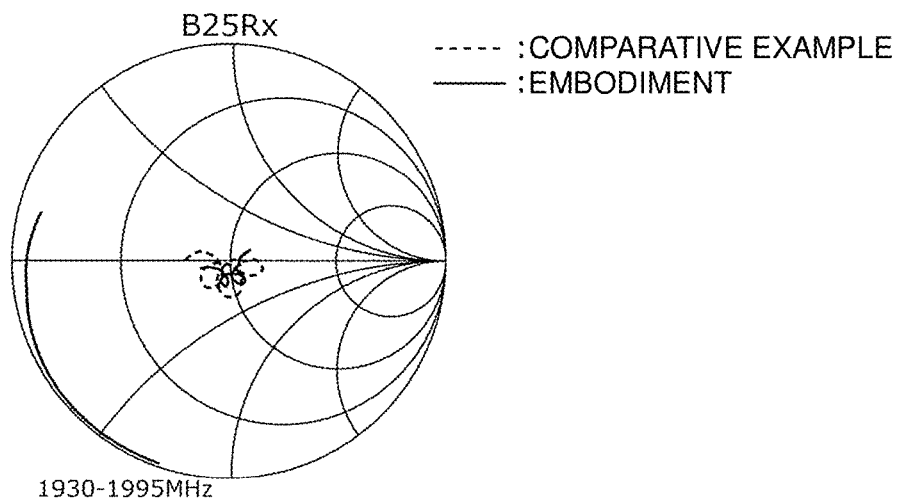
FIG. 11B is a Smith chart showing complex impedance, seen from a reception input terminal, of a reception-side filter of Band25 as a unit according to a preferred embodiment of the present invention.
Figure 12A:
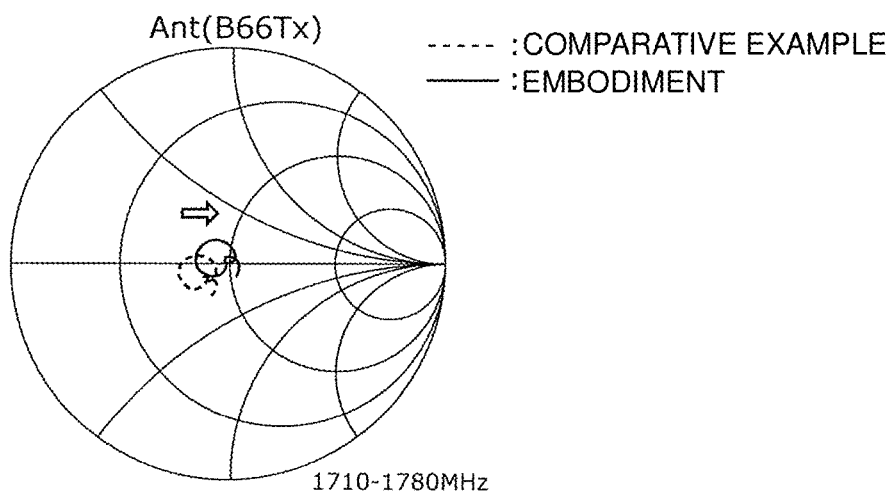
FIG. 12A is a Smith chart showing complex impedance, seen from an antenna connection terminal, of a transmission-side filter of Band66 as a unit according to a preferred embodiment of the present invention.
Figure 12B:
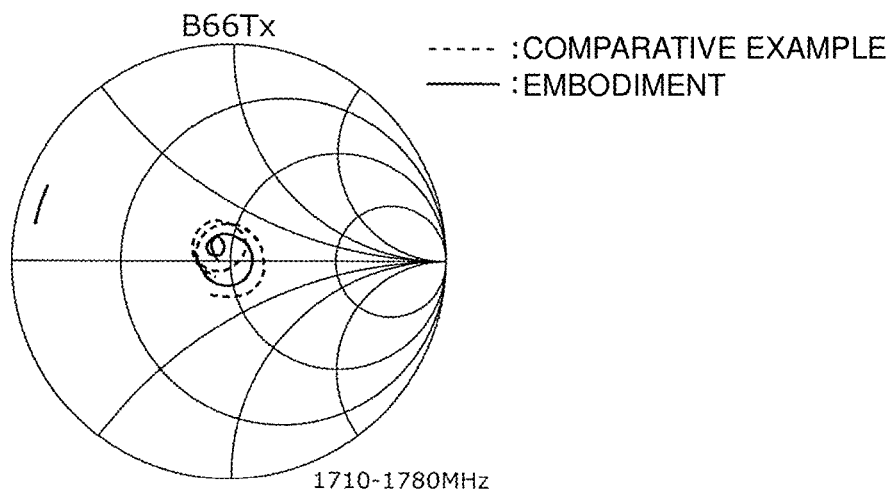
FIG. 12B is a Smith chart showing complex impedance, seen from a transmission output terminal, of a transmission-side filter of Band66 as a unit according to a preferred embodiment of the present invention.
Figure 13A:
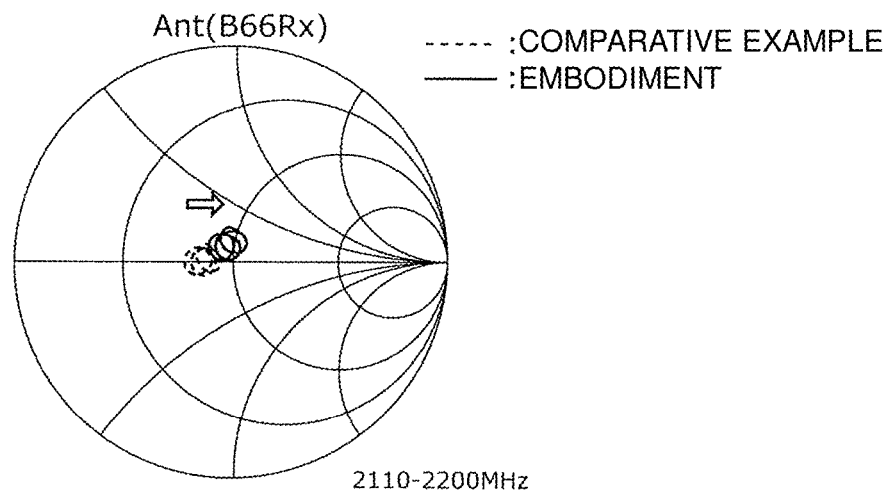
FIG. 13A is a Smith chart showing complex impedance, seen from an antenna connection terminal, of a reception-side filter of Band66 as a unit according to a preferred embodiment of the present invention.
Figure 13B:
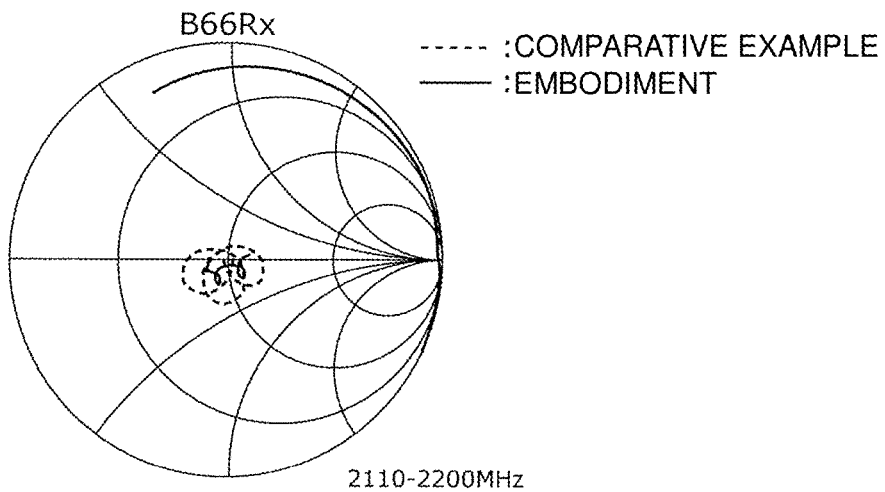
FIG. 13B is a Smith chart showing complex impedance, seen from a reception input terminal, of a reception-side filter of Band66 as a unit according to a preferred embodiment of the present invention.

Here, impedance matching of each filter will be described. FIG. 10A is a Smith chart showing the complex impedance, seen from the antenna connection terminal 60, of the transmission-side filter 11 of Band25 as a unit according to the present preferred embodiment. FIG. 10B is a Smith chart showing the complex impedance, seen from the transmission output terminal 61, of the transmission-side filter 11 of Band25 as a unit according to the present preferred embodiment. FIG. 11A is a Smith chart showing the complex impedance, seen from the antenna connection terminal 60, of the reception-side filter 12 of Band25 as a unit according to the present preferred embodiment. FIG. 11B is a Smith chart showing the complex impedance, seen from the reception input terminal 62, of the reception-side filter 12 of Band25 as a unit according to the present preferred embodiment. FIG. 12A is a Smith chart showing the complex impedance, seen from the antenna connection terminal 60, of the transmission-side filter 13 of Band66 as a unit according to the present preferred embodiment. FIG. 12B is a Smith chart showing the complex impedance, seen from the transmission output terminal 63, of the transmission-side filter 13 of Band66 as a unit according to the present preferred embodiment. FIG. 13A is a Smith chart showing the complex impedance, seen from the antenna connection terminal 60, of the reception-side filter 14 of Band66 as a unit according to the present preferred embodiment. FIG. 13B is a Smith chart showing the complex impedance, seen from the reception input terminal 64, of the reception-side filter 14 of Band66 as a unit according to the present preferred embodiment.

As shown in FIG. 10A, the complex impedance of the transmission-side filter 11 seen from the antenna connection terminal 60 shifts in the positive direction along the real axis in the Smith chart, and approaches 50Ω. Further, as shown in FIG. 10B, it can be said that the complex impedance of the transmission-side filter 11 seen from the transmission output terminal 61 has a small change of impedance, and impedance matching is stably achieved even if the frequency is changed within the pass band. Accordingly, it can be understood that the accuracy of impedance matching is significantly improved in the transmission-side filter 11.

Similarly, the complex impedance, seen from the antenna connection terminal 60, of each of the reception-side filter 12, the transmission-side filter 13, and the reception-side filter 14 shifts in the positive direction along the real axis in the Smith chart and approaches 50Ω, as shown in FIGS. 11A, 12A and 13A, respectively. Further, as shown in FIGS. 11B, 12B and 13B, it can be said that the complex impedance of each of the reception-side filter 12, the transmission-side filter 13, and the reception-side filter 14 respectively seen from the reception input terminal 62, the transmission output terminal 63 and the reception input terminal 64 has a small change in the impedance, and the impedance matching is stably achieved even if the frequency is changed within the pass band.

Accordingly, it can be understood that the accuracy of impedance matching is also significantly improved in the reception-side filter 12, the transmission-side filter 13, and the reception-side filter 14.

6. Summary

As discussed above, the multiplexer 1 according to the present preferred embodiment (1) includes at least three acoustic wave filters, (2) an input terminal or an output terminal of each of the at least three acoustic wave filters is connected to, among a plurality of terminals disposed on a piezoelectric substrate defining each of the filters, an antenna terminal connected to an antenna connection terminal, (3) the at least three acoustic wave filters include a first acoustic wave filter, and a second acoustic wave filter disposed at a farther position from the antenna connection terminal than a position of the first acoustic wave filter in a plan view of the substrate 6, and (4) the second acoustic wave filter takes, among the plurality of terminals disposed on the piezoelectric substrate, a terminal disposed at the closest position to the antenna connection terminal as the antenna terminal.

According to the above features, in the substrate 6, it is possible to shorten the length of the wiring 22a, to which the respective terminals 13b and 12b as the antenna terminals of the transmission-side filter 13 and the reception-side filter 12 are connected, in comparison with a case where the terminals 13c and 12c are taken as the antenna terminals. Note that, of the transmission-side filters 11 and 13 and the reception-side filters 12 and 14 defining the multiplexer 1, the transmission-side filter and the reception-side filter 12 are disposed at a farther position than that of the transmission-side filter 11 and the reception-side filter 14 from the antenna connection terminal 60. As a result, this makes it possible to shorten the length of the wiring connecting the antenna connection terminal 60 and the transmission-side filter 13 as well as the reception-side filter 12. Thus, it is possible to reduce the capacitance generated between the ground and the wiring connecting the antenna connection terminal 60 and the transmission-side filter 13 as well as the reception-side filter 12. Accordingly, the insertion loss of the multiplexer 1 can be reduced.

Further, by providing the wiring 22a connecting the antenna connection terminal 60 and the terminals 13b and 12b as the antenna terminals in a single layer, it is possible to significantly reduce or prevent routing of the wiring across the plurality of layers. As a result, this makes it possible to shorten the length of the wiring connecting the antenna connection terminal 60 and the transmission-side filter 13 as well as the reception-side filter 12. This makes it possible to further reduce the insertion loss of the multiplexer 1.

Further, the wiring 22a, to which the terminals 13b and 12b as the antenna terminals are connected, is not provided in a layer close to the third layer 6c in which the antenna connection terminal 60 is provided, but is provided in the second layer 6b, which is a layer close to the terminals 13b and 12b. This makes it possible to increase the ratio of a single wiring being shared by the wiring connecting the antenna connection terminal 60 and the terminal 13b and the wiring connecting the antenna connection terminal 60 and the terminal 12b, and shorten the total length of wiring from the transmission-side filter 13 and the reception-side filter 12 to the antenna connection terminal 60. With this, the insertion loss of the multiplexer 1 can be further reduced.

Variation 1

Note that the multiplexer according to preferred embodiments of the present invention is not limited to four filters, i.e., the transmission-side filters 11 and 13 and the reception-side filters 12 and 14 are mounted on the substrate 6 as described above.

Figure 14A:
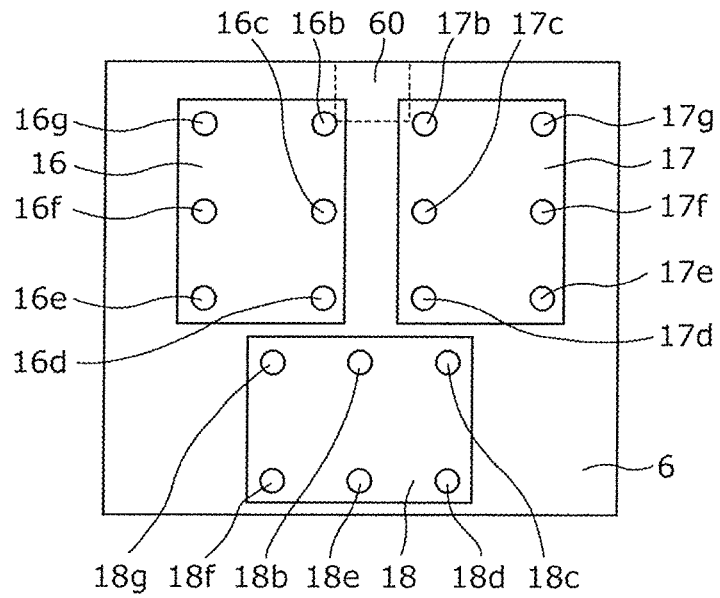
FIG. 14A is a plan view showing an example of an arrangement of a transmission-side filter and a reception-side filter of a multiplexer according to Variation 1 on a preferred embodiment of the present invention.

FIG. 14A is a plan view showing an example of arrangement of a transmission-side filter and a reception-side filter of a multiplexer according to Variation 1 of a preferred embodiment.

The multiplexer shown in FIG. 14A includes three acoustic wave filters. Piezoelectric substrates 16, 17 and 18 defining respective acoustic wave filters are mounted on a substrate 6. Terminals 16b to 16g are provided on the piezoelectric substrate 16. Terminals 17b to 17g are provided on the piezoelectric substrate 17. Terminals 18b to 18g are provided on the piezoelectric substrate 18. In the present variation, the acoustic wave filters including the piezoelectric substrates 16 and 17 are a first acoustic wave filter, and the acoustic wave filter including the piezoelectric substrate 18 is a second acoustic wave filter.

In the piezoelectric substrates 16 and 17 disposed on a side closer to one end of the substrate 6 where an antenna connection terminal 60 is provided, the terminals 16b and 17b disposed at a position closest to the antenna connection terminal are antenna terminals. In the piezoelectric substrate 18 disposed at a position farthest from the antenna connection terminal 60, the terminal 18b disposed at a position closest to the antenna connection terminal 60 is an antenna terminal.

By disposing the terminal 18b as the antenna terminal at the position closest to the antenna connection terminal 60, it is possible to shorten the length of the wiring connecting the terminal 18b and the antenna connection terminal 60 as compared with a case where a terminal other than the terminal 18b is used as the antenna terminal. This makes it possible to shorten the total length of wiring connecting the antenna terminal of each filter and the antenna connection terminal 60.

Variation 2

Further, the multiplexer according to the preferred embodiments of the present invention is not limited to filters of the same size are mounted being oriented in the same direction on the substrate 6 as described above. The size, shape, terminal positions, mounting orientation, and the like of each of the filters may differ from each other.

Figure 14B:
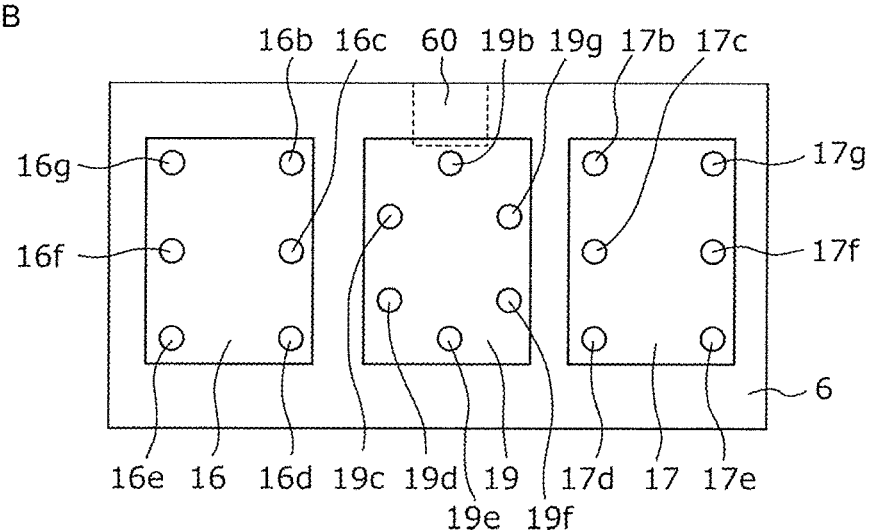
FIG. 14B is a plan view showing an example of an arrangement of a transmission-side filter and a reception-side filter of a multiplexer according to Variation 2 on a preferred embodiment of the present invention.

FIG. 14B is a plan view showing an example of an arrangement of a transmission-side filter and a reception-side filter of a multiplexer according to Variation 2 of a preferred embodiment.

The multiplexer shown in FIG. 14B includes three acoustic wave filters. Piezoelectric substrates 16, 17 and 19 defining respective acoustic wave filters are mounted on a substrate 6. Terminals 16b to 16g are provided on the piezoelectric substrate 16. Terminals 17b to 17g are provided on the piezoelectric substrate 17. Terminals 19b to 19g are provided on the piezoelectric substrate 19. In the present variation, the acoustic wave filter including the piezoelectric substrate 19 is a first acoustic wave filter, and the acoustic wave filters including the piezoelectric substrates 16 and 17 are a second acoustic wave filter.

In the piezoelectric substrate 19 disposed on a side closer to one end of the substrate 6 where an antenna connection terminal 60 is provided, the terminal 19b disposed at a position closest to the antenna connection terminal 60 is an antenna terminal. In the piezoelectric substrates 16 and 17 disposed at positions farther than a position of the piezoelectric substrate 19 from the antenna connection terminal 60, the terminals 16b and 17b disposed at positions closest to the antenna connection terminal 60 are antenna terminals.

By disposing the terminals 16b and 17b as antenna terminals at the positions closest to the antenna connection terminal 60, it is possible to shorten the length of the wiring connecting the terminals 16b and 17b and the antenna connection terminal 60 as compared with a case where other terminals are used as the antenna terminals. This makes it possible to shorten the total length of wiring connecting the antenna terminal of each filter and the antenna connection terminal 60.

Other Variations

Although the multiplexers according to preferred embodiments of the present invention have been described with reference to the present preferred embodiment of the quadplexer, the present invention is not limited to the above-described preferred embodiments and variations thereof. For example, a mode in which the following variation is applied to the above-described preferred embodiments can also be included in the present invention.

Figure 15:
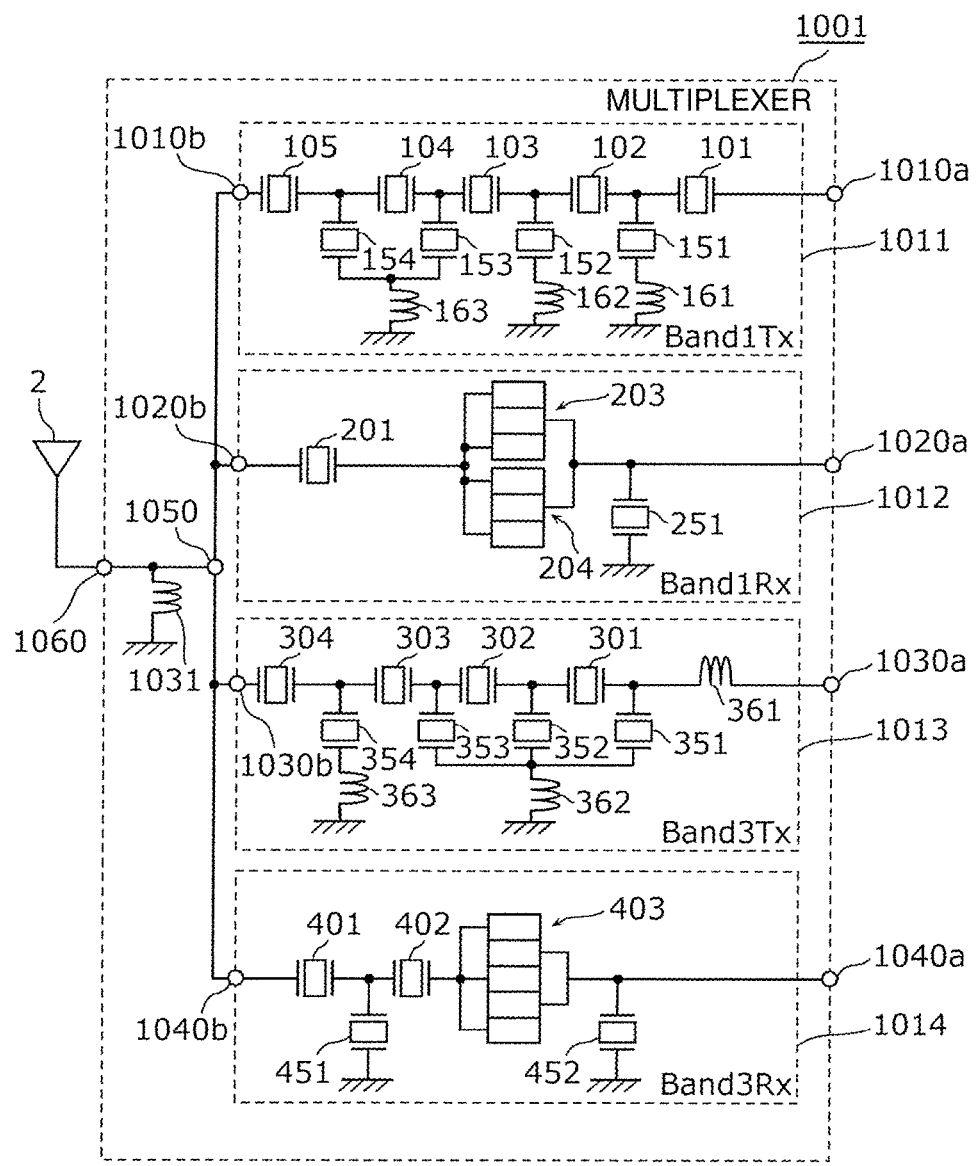
FIG. 15 is a circuit diagram of a multiplexer according to another variation on a preferred embodiment of the present invention.

For example, the multiplexer according to the present invention is not limited to the quadplexer of Band25+Band66 as in the above-described preferred embodiment. FIG. 15 is a circuit diagram of a multiplexer 1001 according to another variation on a preferred embodiment. For example, as shown in FIG. 15, the multiplexer according to the present variation may be a quadplexer 1001 including four frequency bands applied to a system in which combined are a transmission-side filter 1011 of Band1 and a reception-side filter 1012 of Band1 having a transmission band and a reception band, and a transmission-side filter 1013 of Band3 and a reception-side filter 1014 of Band3 having a transmission band and a reception band. In this case, for example, an inductance element may be connected in series between a reception input terminal 1020b of the reception-side filter of Band1 and a common connection terminal 1050. In FIG. 15, transmission output terminals 1010b and 1030b, the reception input terminal 1020b and a reception input terminal 1040b, transmission input terminals 1010a and 1030a, reception output terminals 1020a and 1040a, the common connection terminal 1050, and an antenna connection terminal 1060 correspond to the transmission output terminals 61 and 63, the reception input terminals 62 and 64, the transmission input terminals 10 and 30, the reception output terminals 20 and 40, the common connection terminal 50 and the antenna connection terminal 60 in the multiplexer 1, respectively.

Note that, in the multiplexer 1 according to the present variation, the inductance element 31 connected between the common connection terminal 50 and the antenna connection terminal 60 is not limited to being connected in series between the common connection terminal 50 and the antenna connection terminal 60. Like an inductance element 1031 shown in FIG. 15, the inductance element 1031 may be connected between a reference terminal and a connection path between the common connection terminal 1050 and the antenna connection terminal 1060.

Further, the multiplexer 1 according to a preferred embodiment of the present invention may include a plurality of acoustic wave filters having the above-discussed features and the inductance elements 21 and 31 on chips are mounted on a high frequency substrate. Furthermore, each of the inductance elements 21 and 31 may be provided of a conductor pattern of a high frequency substrate, or may be a chip inductor, for example.

In addition, in the piezoelectric film 53 of the piezoelectric substrate 5 according to the above-described preferred embodiment, an about 50° Y-cut X-propagation $LiTaO_3$ single crystal is used, but the cut angle of the single crystal material is not limited thereto. In other words, in the case of using a LiTaO$_3$ substrate as a piezoelectric substrate, the cut angle of the piezoelectric substrate of the surface acoustic wave filter defining the multiplexer according to the above-described preferred embodiment is not limited to 50° Y. Even with a surface acoustic wave filter using a LiTaO$_3$ piezoelectric substrate having a cut angle other than the above-mentioned one, a similar advantageous effect can be obtained.

Further, a multiplexer according to a preferred embodiment of the present invention may be a hexaplexer including six frequency bands applied to a system in which Band25, Band66 and Band30 each having a transmission band and a reception band are combined. In the multiplexer according to preferred embodiments of the present invention, as the number of acoustic wave filters increases, insertion loss in the pass band can be reduced as compared with a multiplexer defined by an existing matching method.

Further, a multiplexer according to a preferred embodiment of the present invention may not include a plurality of duplexers to perform transmission and reception operations. For example, the multiplexer can be used as a transmitting device having a plurality of transmission frequency bands. That is, a multiplexer according to a preferred embodiment of the present invention may preferably be a transmitting device that inputs a plurality of high frequency signals having mutually different carrier frequency bands, filters the plurality of high frequency signals, and wirelessly transmits the filtered high frequency signals from an antenna element being shared, and including an antenna connection terminal disposed on one surface of a substrate and connected to the antenna element; and at least three acoustic wave filters for transmission mounted on the other surface of the substrate opposing the one surface of the substrate, and that input a plurality of high frequency signals from a transmitting circuit and each allow only a predetermined frequency band to pass through. In the stated transmitting device, the at least three acoustic wave filters for transmission are common-connected to a common connection terminal; a first inductance element is connected in a connection path between the antenna connection terminal and the common connection terminal; each of the at least three acoustic wave filters for transmission includes, on a piezoelectric substrate, at least one of a serial arm resonator connected between an input terminal and an output terminal, and a parallel arm resonator connected between a reference terminal and a connection path connecting the input terminal and the output terminal; the output terminal is connected to, among a plurality of terminals disposed on the piezoelectric substrate, an antenna terminal connected to the antenna connection terminal; the at least three acoustic wave filters for transmission include at least one first acoustic wave filter for transmission and at least one second acoustic wave filter for transmission that is disposed at a farther position than a position of the first acoustic wave filter for transmission from the antenna connection terminal in a plan view of the substrate; and the second acoustic wave filter for transmission takes, among the plurality of terminals, a terminal disposed at the closest position to the antenna connection terminal in the plan view of the substrate as the antenna terminal.

Further, a multiplexer according to a preferred embodiment of the present invention may be used, for example, as a receiving device having a plurality of reception frequency bands. That is, the multiplexer may preferably be a receiving device that inputs, via an antenna element, a plurality of high frequency signals having mutually different carrier frequency bands, demultiplexes the plurality of high frequency signals, and outputs the demultiplexed high frequency signals to a receiving circuit, and including an antenna connection terminal disposed on one surface of a substrate and connected to the antenna element; and at least three acoustic wave filters for reception mounted on the other surface of the substrate opposing the one surface of the substrate, and that input a plurality of high frequency signals from the antenna element and each allow only a predetermined frequency band to pass through. In the stated receiving device, the at least three acoustic wave filters for reception are common-connected to a common connection terminal; a first inductance element is connected in a connection path between the antenna connection terminal and the common connection terminal; each of the at least three acoustic wave filters for reception includes, on a piezoelectric substrate, at least one of a serial arm resonator connected between an input terminal and an output terminal, and a parallel arm resonator connected between a reference terminal and a connection path connecting the input terminal and the output terminal; the input terminal is connected to, among a plurality of terminals disposed on the piezoelectric substrate, an antenna terminal connected to the antenna connection terminal; the at least three acoustic wave filters for reception include at least one first acoustic wave filter for reception and at least one second acoustic wave filter for reception that is disposed at a farther position than a position of the first acoustic wave filter for reception from the antenna connection terminal in a plan view of the substrate; and the second acoustic wave filter for reception takes, among the plurality of terminals, a terminal disposed at the closest position to the antenna connection terminal in the plan view of the substrate as the antenna terminal.

Even with the transmitting device or the receiving device having the above-described features, the same or substantially the same advantageous effects as that of the multiplexer 1 according to the above-described preferred embodiment can be achieved.

In the above preferred embodiments, a surface acoustic wave filter including IDT electrodes is shown as the transmission-side filter and the reception-side filter defining the multiplexer, the quadplexer, the transmitting device, and the receiving device. However, each of the filters defining the multiplexer, the quadplexer, the transmitting device, and the receiving device may be an acoustic wave filter that includes a serial arm resonator and a parallel arm resonator and uses a boundary acoustic wave or a BAW (Bulk Acoustic Wave). This also provides advantageous effects similar to that of the multiplexer, the quadplexer, the transmitting device, and the receiving device according to the above preferred embodiment.

Further, in the multiplexer 1 according to the above preferred embodiment, although the configuration in which the inductance element 21 is connected in series to the reception-side filter 12 is shown and described, a configuration in which the inductance element 21 is connected in series to the transmission-side filters 11 or 13, or to the reception-side filter 14 is also included in preferred embodiments of the present invention. In other words, the multiplexer according to preferred embodiments of the present invention may include a plurality of acoustic wave filters having mutually different pass bands; a common connection terminal to which a first inductance element is connected in series in a connection path between an antenna element and the common connection terminal; and a second inductance element. In the stated multiplexer, among the plurality of acoustic wave filters, an output terminal of a transmission-side filter is connected to the common connection terminal via the second inductance element connected to the stated output terminal and the common connection terminal, and is also connected to a parallel arm resonator; among input terminals and output terminals of the acoustic wave filters other than the above transmission-side filter, a terminal on the antenna element side is connected to the common connection terminal, and is also connected to a serial arm resonator among serial arm resonators and parallel arm resonators. This also makes it possible to provide a low-loss multiplexer even in a case where the number of bands and the number of modes to be supported increase.

INDUSTRIAL APPLICABILITY

Preferred embodiments of the present invention can be widely used for communication apparatuses, for example, cellular phones, as a low-loss multiplexer, a low-loss transmitting device, and a low-loss receiving device able to conform to multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives a plurality of high frequency signals via an antenna element, comprising:
    an antenna connection terminal provided on a first surface of a substrate and connected to the antenna element; and
    at least three acoustic wave filters mounted on a second surface of the substrate opposing the first surface; wherein
    the at least three acoustic wave filters have mutually different pass bands;
    the at least three acoustic wave filters are connected to a common connection terminal;
    a first inductance element is connected in a connection path between the antenna connection terminal and the common connection terminal;
    each of the at least three acoustic wave filters includes, on a piezoelectric substrate, at least one of a serial arm resonator connected between an input terminal and an output terminal, and a parallel arm resonator connected between a reference terminal and a connection path connecting the input terminal and the output terminal;
    the input terminal or the output terminal is connected to, among a plurality of terminals provided on the piezoelectric substrate, an antenna terminal connected to the antenna connection terminal;
    the at least three acoustic wave filters include at least one first acoustic wave filter and at least one second acoustic wave filter located at a farther position from the antenna connection terminal than a position of the first acoustic wave filter in a plan view of the substrate; and
    among the plurality of terminals, a terminal located at a closest position to the antenna connection terminal in the plan view of the substrate is connected to the second acoustic wave filter as the antenna terminal.

2. The multiplexer according to claim 1, wherein
    the at least three acoustic wave filters include two or more of the second acoustic wave filters; and
    the antenna terminals of the two or more second acoustic wave filters are connected on the substrate and then connected to the common connection terminal.

3. The multiplexer according to claim 2, wherein
    the substrate includes a plurality of layers; and
    wiring connecting the antenna connection terminal and the antenna terminals of the two or more second acoustic wave filters is provided in one of the plurality of layers.

4. The multiplexer according to claim 3, wherein the wiring is provided on the second surface of the substrate.

5. The multiplexer according to claim 1, wherein each of the at least three acoustic wave filters is provided on the single piezoelectric substrate.

6. The multiplexer according to claim 1, wherein the piezoelectric substrate includes:
    a piezoelectric film, on a first surface of which an IDT (InterDigital Transducer) electrode is provided;
    a high acoustic-velocity support substrate in which a bulk wave propagates at a higher acoustic velocity than an acoustic velocity of an acoustic wave that propagates in the piezoelectric film; and
    a low acoustic-velocity film which is located between the high acoustic-velocity support substrate and the piezoelectric film, and in which a bulk wave propagates at a lower acoustic velocity than an acoustic velocity of a bulk wave that propagates in the piezoelectric film.

7. The multiplexer according to claim 1, further comprising, as the at least three acoustic wave filters:
    a third acoustic wave filter having a first pass band and outputting a transmission signal to the antenna element;
    a fourth acoustic wave filter having a second pass band adjacent to or in a vicinity of the first pass band and inputting a reception signal from the antenna element;
    a fifth acoustic wave filter having a third pass band on a lower frequency side relative to the first pass band and the second pass band, and outputting a transmission signal to the antenna element; and
    a sixth acoustic wave filter having a fourth pass band on a higher frequency side relative to the first pass band and the second pass band, and inputting a reception signal from the antenna element; wherein
    a second inductance element is connected between the common connection terminal and at least one of the second acoustic wave filter and the fourth acoustic wave filter.

8. The multiplexer according to claim 1, wherein the at least three acoustic wave filters include at least one first acoustic wave filter that is a non-balanced input and non-balanced output band pass filter.

9. The multiplexer according to claim 8, wherein each of the at least three acoustic wave filters is a non-balanced input and non-balanced output band pass filter.

10. The multiplexer according to claim 1, wherein the at least three acoustic wave filters include at least one first acoustic wave filter that is defined by a pair of comb-shaped electrodes that are provided on the piezoelectric substrate.

11. The multiplexer according to claim 1, wherein the first inductance element is connected in series between the common connection terminal and at least one first acoustic wave filter of the at least three acoustic wave filters.

12. The multiplexer according to claim 1, wherein the first inductance element is connected in parallel between the common connection terminal and at least one first acoustic wave filter of the at least three acoustic wave filters.

13. The multiplexer according to claim 1, wherein the reference terminal is connected to ground.

14. The multiplexer according to claim 1, wherein the at least three acoustic wave filters include at least one first acoustic wave filter that is a ladder band pass filter.

15. The multiplexer according to claim 1, wherein the at least three acoustic wave filters include at least one first acoustic wave filter that filters a transmission or reception wave in a pass band of about 1850-1915 MHz, a pass band of about 1930-1995 MHz, a pass band of about 1710-1780 MHz, or a pass and of about 2110-2200 MHZ.

16. A transmitting device that inputs a plurality of high frequency signals having mutually different carrier frequency bands, filters the plurality of high frequency signals, and wirelessly transmits the filtered high frequency signals from an antenna element being shared, the transmitting device comprising:
- an antenna connection terminal provided on a first surface of a substrate and connected to the antenna element; and
- at least three acoustic wave filters for transmission mounted on a second surface of the substrate opposing the first surface, which input a plurality of high frequency signals from a transmitting circuit and each allow only a predetermined frequency band to pass through; wherein
- the at least three acoustic wave filters for transmission are common-connected to a common connection terminal;
- a first inductance element is connected in a connection path between the antenna connection terminal and the common connection terminal;
- each of the at least three acoustic wave filters for transmission includes, on a piezoelectric substrate, at least one of a serial arm resonator connected between an input terminal and an output terminal, and a parallel arm resonator connected between a reference terminal and a connection path connecting the input terminal and the output terminal;
- the output terminal is connected to, among a plurality of terminals provided on the piezoelectric substrate, an antenna terminal connected to the antenna connection terminal;
- the at least three acoustic wave filters for transmission include at least one first acoustic wave filter for transmission and at least one second acoustic wave filter for transmission that is located at a farther position than a position of the first acoustic wave filter for transmission from the antenna connection terminal in a plan view of the substrate; and
- among the plurality of terminals, a terminal located at the closest position to the antenna connection terminal in the plan view of the substrate is connected to the second acoustic wave filter for transmission as the antenna terminal.

17. A receiving device that inputs, via an antenna element, a plurality of high frequency signals having mutually different carrier frequency bands, demultiplexes the plurality of high frequency signals, and outputs the demultiplexed high frequency signals to a receiving circuit, the receiving device comprising:
- an antenna connection terminal provided on a first surface of a substrate and connected to the antenna element; and
- at least three acoustic wave filters for reception mounted on a second surface of the substrate opposing the first surface, which input a plurality of high frequency signals from the antenna element and each allow only a predetermined frequency band to pass through; wherein
- the at least three acoustic wave filters for reception are common-connected to a common connection terminal;
- a first inductance element is connected in a connection path between the antenna connection terminal and the common connection terminal;
- each of the at least three acoustic wave filters for reception includes, on a piezoelectric substrate, at least one of a serial arm resonator connected between an input terminal and an output terminal, and a parallel arm resonator connected between a reference terminal and a connection path connecting the input terminal and the output terminal;
- the input terminal is connected to, among a plurality of terminals provided on the piezoelectric substrate, an antenna terminal connected to the antenna connection terminal;
- the at least three acoustic wave filters for reception include at least one first acoustic wave filter for reception and at least one second acoustic wave filter for reception located at a farther position than a position of the first acoustic wave filter for reception from the antenna connection terminal in a plan view of the substrate; and
- among the plurality of terminals, a terminal located at the closest position to the antenna connection terminal in the plan view of the substrate is connected to the second acoustic wave filter for reception as the antenna terminal.

* * * * *